(12) United States Patent
Zhang et al.

(10) Patent No.: US 12,200,986 B2
(45) Date of Patent: Jan. 14, 2025

(54) DISPLAY SUBSTRATE, MANUFACTURING METHOD THEREOF, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Bo Zhang, Beijing (CN); Rong Wang, Beijing (CN); Yulong Wei, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 631 days.

(21) Appl. No.: 17/436,149

(22) PCT Filed: Mar. 12, 2020

(86) PCT No.: PCT/CN2020/079005
§ 371 (c)(1),
(2) Date: Sep. 3, 2021

(87) PCT Pub. No.: WO2021/179251
PCT Pub. Date: Sep. 16, 2021

(65) Prior Publication Data
US 2022/0328599 A1    Oct. 13, 2022

(51) Int. Cl.
*H10K 59/131*   (2023.01)
*G01R 31/28*    (2006.01)
(Continued)

(52) U.S. Cl.
CPC ....... *H10K 59/131* (2023.02); *G01R 31/2884* (2013.01); *H10K 71/00* (2023.02);
(Continued)

(58) Field of Classification Search
None
See application file for complete search history.

(56) References Cited

U.S. PATENT DOCUMENTS 11,233,021 B2    1/2022  Lu et al.
11,532,690 B2 *  12/2022 Liu ...................... H10K 59/131
(Continued)

FOREIGN PATENT DOCUMENTS

CN    204463778 U    7/2015
CN    107544720 A    1/2018
(Continued)

OTHER PUBLICATIONS

International Search Report of PCT/CN2020/079005 in Chinese, mailed Dec. 10, 2020 with English translation.
(Continued)

*Primary Examiner* — Michael Lebentritt
(74) *Attorney, Agent, or Firm* — Collard & Roe, P.C.; William Collard

(57) ABSTRACT

A display substrate, a manufacturing method thereof, and a display device are provided. The display substrate includes a base substrate, a sub-pixel unit, a data line, a scan line, a plurality of test contact pads, a first peripheral-zone insulating layer and an auxiliary electrode layer. The base substrate includes a display zone and a peripheral zone, the peripheral zone including a test bonding zone. Each of the plurality of test contact pads includes a first test-contact-pad metal layer and a second test-contact-pad metal layer, wherein the second test-contact-pad metal layer covers the first test-contact-pad metal layer and contacts the first test-contact-pad metal layer in at least portion of a periphery of the first test-contact-pad metal layer. The auxiliary electrode layer includes a plurality of first relay electrode patterns
(Continued)

located within the test bonding zone and a plurality of auxiliary electrodes located within the display zone.

19 Claims, 13 Drawing Sheets

(51) Int. Cl.
 *H01L 23/00* (2006.01)
 *H10K 59/12* (2023.01)
 *H10K 71/00* (2023.01)

(52) U.S. Cl.
 CPC .... *H01L 24/06* (2013.01); *H01L 2224/06155* (2013.01); *H10K 59/1201* (2023.02)

(56) References Cited

U.S. PATENT DOCUMENTS

| | | |
|---|---|---|
| 2017/0371447 A1 | 12/2017 | Fukushima |
| 2019/0116662 A1 | 4/2019 | Li et al. |
| 2020/0211477 A1* | 7/2020 | Lai ...................... G09G 3/3258 |
| 2023/0048918 A1* | 2/2023 | Long ..................... H10K 59/131 |
| 2023/0127411 A1* | 4/2023 | Liu ....................... H10K 59/122 |
| | | 345/174 |
| 2024/0023397 A1* | 1/2024 | Liu ........................ H10K 59/40 |

FOREIGN PATENT DOCUMENTS

| | | | |
|---|---|---|---|
| CN | 109725447 A | | 5/2019 |
| CN | 110289225 A | | 9/2019 |
| CN | 110867139 A | | 3/2020 |
| CN | 111261675 A * | 6/2020 | ........... G06F 1/1616 |
| CN | 113451385 A * | 9/2021 | |

OTHER PUBLICATIONS

Notice of Transmittal of the International Search Report of PCT/CN2020/079005 in Chinese, mailed Dec. 10, 2020.
Written Opinion of the International Searching Authority of PCT/CN2020/079005 in Chinese, mailed Dec. 10, 2020.
Chinese Office Action in Chinese Application No. 202080000262.1 dated Mar. 31, 2023 with English translation.

\* cited by examiner

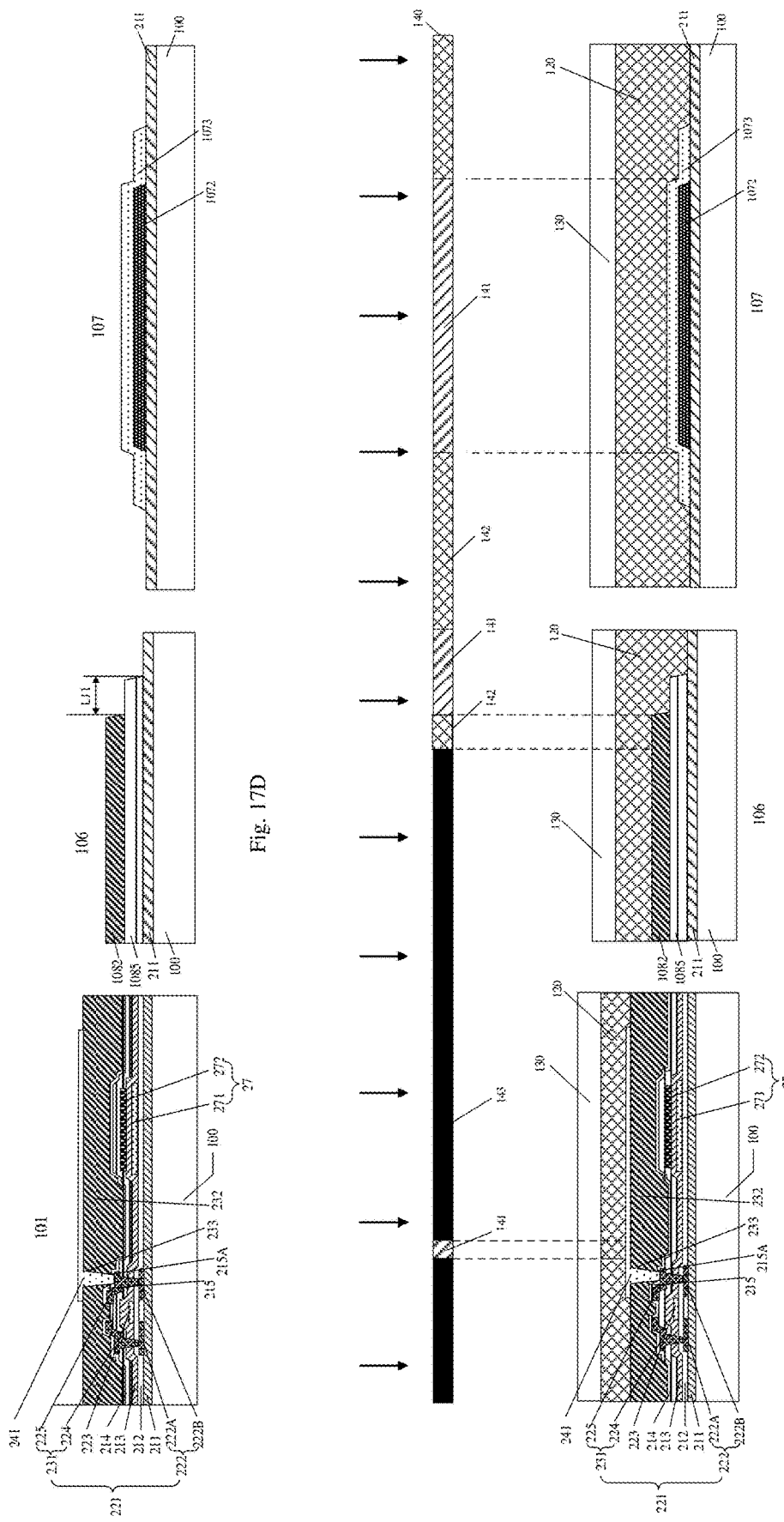

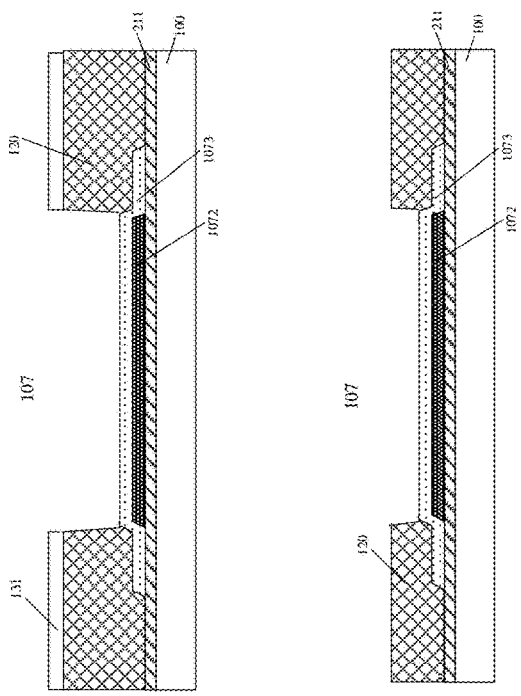
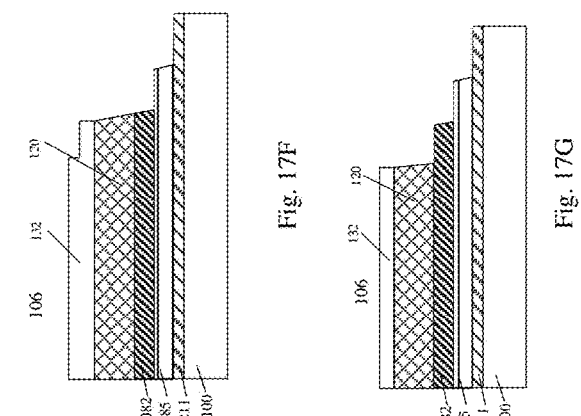
Fig. 17F
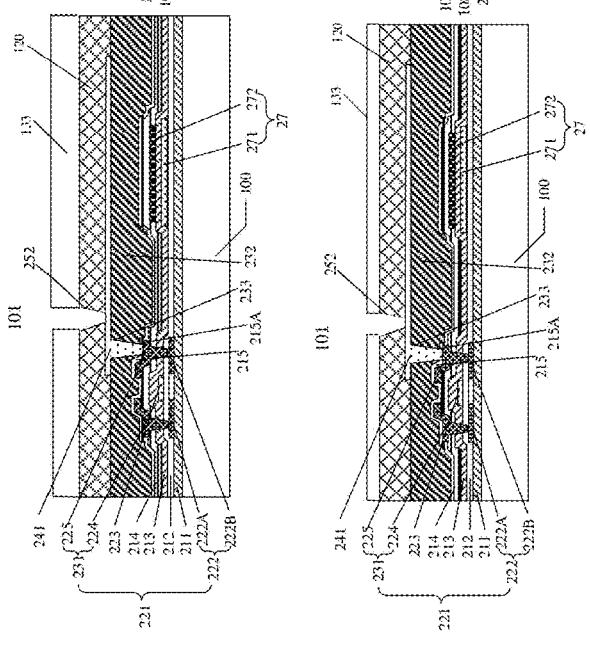
Fig. 17G
Fig. 17H

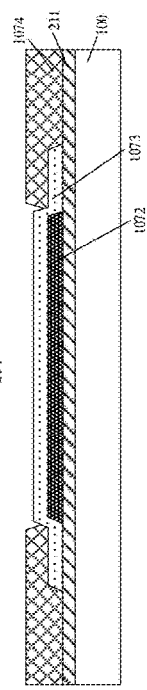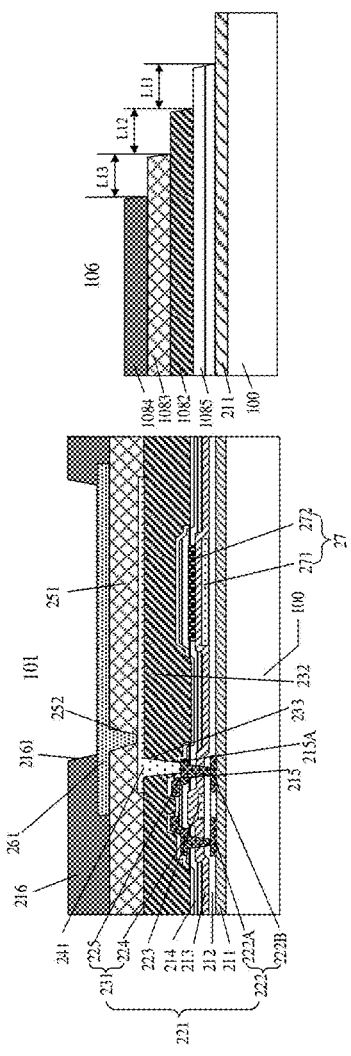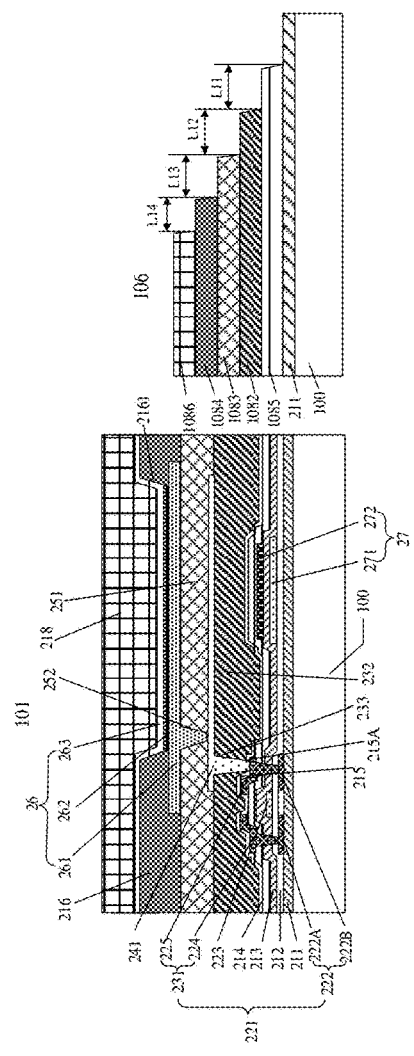
Fig. 17I
Fig. 17J

DISPLAY SUBSTRATE, MANUFACTURING METHOD THEREOF, AND DISPLAY DEVICE

CROSS REFERENCE TO RELATED APPLICATIONS

This application is the National Stage of PCT/CN2020/079005 filed on Mar. 12, 2020, the disclosure of which is incorporated by reference.

TECHNICAL FIELD

Embodiments of the present disclosure relate to a display substrate, a manufacturing method thereof, and a display device.

BACKGROUND

In the display industry, with increasing development of display technology, the market of Flexible Organic Light-Emitting Diodes (Flexible OLEDs) is growing. Active-matrix organic light-emitting diodes (AMOLEDs) which are predominant in the flexible OLEDs have been widely used. Typically, a general manufacturing process of AMOLED comprises a process for manufacturing an array, a process for evaporating a luminescent material, a cutting process, a module process, and so on. A lighting test process is performed after the cutting process. A detection probe inputs a test signal via contact pad in the test bonding zone, and detects the black-and-white bar picture, monochrome picture and gray-scale picture through the test unit, so as to provide a level of display performance and improve the product yield.

SUMMARY

For example, at least an embodiment of the present discloses provides a display substrate comprising: a base substrate, comprising a display zone and a peripheral zone surrounding at least the display zone, the peripheral zone comprising a test bonding zone located on a side of the display zone; a sub-pixel unit, located within the display zone and comprising: a pixel structure comprising a pixel drive circuit, a first planarization layer, a first relay electrode, a second planarization layer and a light-emitting element, wherein the pixel drive circuit comprises a first display-zone metal layer, the first planarization layer is disposed on a side of the pixel drive circuit away from the base substrate to provide a first planarization surface and comprises a first via-hole, the first relay electrode is disposed on the first planarization surface and electrically connected with the first display-zone metal layer of the pixel drive circuit through the first via-hole, the second planarization layer is disposed on a side of the first relay electrode away from the base substrate to provide a second planarization surface and comprises a second via-hole, and the light-emitting element is disposed on the second planarization surface and electrically connected with the first relay electrode through the second via-hole; a data line, located within the display zone and configured to provide a data signal to the sub-pixel unit; a scan line, located within the display zone and configured to provide a control signal to the sub-pixel unit; a plurality of test contact pads, located within the test bonding zone, wherein each of the plurality of the test contact pads comprises a first test-contact-pad metal layer and a second test-contact-pad metal layer, the first test-contact-pad metal layer is located on the base substrate, the second test-contact-pad metal layer is located on a side of the first test-contact-pad metal layer away from the base substrate, and the second test-contact-pad metal layer covers the first test-contact-pad metal layer and contacts the first test-contact-pad metal layer in at least portion of a periphery of the first test-contact-pad metal layer; a first peripheral-zone insulating layer, located within the test bonding zone and configured to expose surfaces of the plurality of the test contact pads facing away from the base substrate and cover at least portion of a periphery of the second test-contact-pad metal layer; an auxiliary electrode layer, comprising a plurality of first relay electrode patterns located within the test bonding zone and a plurality of auxiliary electrodes located within the display zone, the plurality of the auxiliary electrodes are located on a side of the sub-pixel unit away from the base substrate, the plurality of the first relay electrode patterns are located on a side of the first peripheral-zone insulating layer and the plurality of the test contact pads away from the base substrate, wherein the first display-zone metal layer and the first test-contact-pad metal layer are arranged in the same layer, the first relay electrode and the second test-contact-pad metal layer are arranged in a same layer, the first peripheral-zone insulating layer and the second planarization layer are arranged in a same layer, and the auxiliary electrodes and the first relay electrode patterns are arranged in a same layer.

For example, in the display substrate provided in at least an embodiment of the present discloses, a step difference in a direction perpendicular to the base substrate is provided between a surface of the first relay electrode pattern above the test contact pad away from the base substrate and a surface of the first relay electrode pattern on a periphery of the test contact pad away from the base substrate, and the step difference is ranged from 1.0 μm to 1.5 μm For example, in the display substrate provided in at least an embodiment of the present discloses, the second test-contact-pad metal layer completely covers the first test-contact-pad metal layer and contacts the first test-contact-pad metal layer on the periphery of the first test-contact-pad metal layer.

For example, in the display substrate provided in at least an embodiment of the present discloses, the pixel drive circuit further comprises a gate electrode, two source-drain electrodes and an interlayer insulating layer located on a side of the gate electrode away from the base substrate and on a side of the two source-drain electrodes adjacent to the base substrate, wherein the two source-drain electrodes are located within the first display-zone metal layer.

For example, in the display substrate provided in at least an embodiment of the present discloses, a vertical distance between a surface of the first peripheral-zone insulating layer away from the base substrate and the base substrate is greater than a vertical distance between the surfaces of the plurality of the test contact pads facing away from the base substrate and the base substrate.

For example, in the display substrate provided in at least an embodiment of the present discloses, the plurality of the test contact pads are arranged in a row and parallel to each other, wherein a row direction of the plurality of the test contact pads is parallel to an extension direction of a side edge of the display zone facing towards the test bonding zone.

For example, the display substrate provided in at least an embodiment of the present discloses further comprises: connection lines located within the peripheral zone, each connection line being electrically connected with the data line of the display zone, a test unit located within the peripheral zone, wherein the test unit is located between the display zone and the test bonding zone, and ends of the connection lines away from the display zone are gathered in the test unit, the first test-contact-pad metal layer of each of the plurality of the test contact pads is electrically connected with the test unit, and the first test-contact-pad metal layer of another of the plurality of the test contact pads is electrically connected with the scan line in the display zone.

For example, the display substrate provided in at least an embodiment of the present discloses further comprises: a second peripheral-zone insulating layer, wherein the second peripheral-zone insulating layer is located within the test bonding zone, the second peripheral-zone insulating layer is disposed between the first peripheral-zone insulating layer and the plurality of the first relay electrode patterns and between the plurality of the test contact pads and the plurality of the first relay electrode patterns to cover the first peripheral-zone insulating layer and the plurality of the test contact pads, and the second peripheral-zone insulating layer has a plurality of first test-contact-pad via-holes to expose the surfaces of the plurality of the test contact pads, respectively, the plurality of the first relay electrode patterns are electrically connected with the plurality of the test contact pads through the plurality of the first test-contact-pad via-holes.

For example, the display substrate provided in at least an embodiment of the present discloses further comprises a first display-zone insulating layer located within the display zone, wherein the first display-zone insulating layer is located between the light-emitting element and the plurality of the auxiliary electrodes, wherein the second peripheral-zone insulating layer and the first display-zone insulating layer are arranged in a same layer.

For example, in the display substrate provided in at least an embodiment of the present discloses, the display substrate further comprising a marker metal layer, wherein the marker metal layer is located on a side of the first peripheral-zone insulating layer adjacent to the base substrate, arranged in a same layer as the first test-contact-pad metal layer, and electrically connected with the first test-contact-pad metal layer of the test contact pad on a periphery of the test bonding zone.

For example, in the display substrate provided in at least an embodiment of the present discloses, the peripheral zone further comprises a bonding peripheral zone surrounding at least the test bonding zone, the display substrate further comprises: a peripheral-zone insulating laminate, located within the bonding peripheral zone and on the base substrate, wherein the peripheral-zone insulating laminate comprises a plurality of insulating layers, wherein one insulating layer of the at least two insulating layers away from the base substrate exposes the other insulating layer of the at least two insulating layers on a side of the one insulating layer adjacent to the base substrate so as to form at least two stepped structure on the periphery of the test bonding zone.

For example, in the display substrate provided in at least an embodiment of the present discloses, the peripheral-zone insulating laminate comprises a first sublayer, a second sublayer and a third sublayer, the third sublayer is located on a side of the first sublayer away from the base substrate, and the second sublayer is located between the first sublayer and the third sublayer, wherein the second sublayer exposes the first sublayer on a side of the second sublayer adjacent to the base substrate, and the third sublayer exposes the second sublayer on a side of the third sublayer adjacent to the base substrate, wherein the first sublayer and the first planariza-tion layer are arranged in a same layer, and the second sublayer and the second planarization layer are arranged in a same layer.

For example, in the display substrate provided in at least an embodiment of the present discloses, the pixel structure further comprises a pixel definition layer, and the light-emitting element comprises a first electrode, a light-emitting layer and a second electrode, wherein the first electrode of the light-emitting element is electrically connected with one of the two source-drain electrodes through the first via-hole in the first planarization layer, the pixel definition layer is disposed on a side of the first electrode away from the base substrate, the pixel definition layer comprises a plurality of openings, the light-emitting layer is disposed in the plurality of the openings of the pixel definition layer, and the second electrode is disposed on a side of the light-emitting layer and the pixel definition layer away from the base substrate, the third sublayer and the pixel definition layer are arranged in a same layer.

For example, in the display substrate provided in at least an embodiment of the present discloses, the first sublayer exposed by the second sublayer on the periphery of the test bonding zone has a size in a range of 8 μm to 12 μm, and the second sublayer exposed by the third sublayer on the periphery of the test bonding zone has a size in a range of 8 μm to 12 μm.

For example, in the display substrate provided in at least an embodiment of the present discloses, the peripheral-zone insulating laminate further comprises a fourth sublayer, the fourth sublayer is located on a side of the first sublayer adjacent to the base substrate, wherein the first sublayer exposes the fourth sublayer on a side of the first sublayer adjacent to the base substrate.

For example, in the display substrate provided in at least an embodiment of the present discloses, the pixel structure further comprises a passivation layer, the passivation layer is located between the pixel drive circuit and the first planarization layer and comprises a passivation-layer via-hole, the pixel drive circuit is further electrically connected with the first relay electrode through the passivation-layer via-hole, wherein the fourth sublayer and the passivation layer are arranged in a same layer.

For example, in the display substrate provided in at least an embodiment of the present discloses, the fourth sublayer exposed by the first sublayer on the periphery of the test bonding zone has a size in a range of 8 μm to 12 μm.

For example, in the display substrate provided in at least an embodiment of the present discloses, the peripheral-zone insulating laminate further comprises a fifth sublayer, the fifth sublayer is located on a side of the third sublayer away from the base substrate, wherein the fifth sublayer exposes the third sublayer on a side of the fifth sublayer adjacent to the base substrate, and the fifth sublayer and the first display-zone insulating layer are arranged in a same layer.

For example, in the display substrate provided in at least an embodiment of the present discloses, the third sublayer exposed by the fifth sublayer on the periphery of the test bonding zone has a size in a range of 8 μm to 12 μm.

For example, at least an embodiment of the present discloses provides a display device, comprising the aforementioned display substrate.

For example, at least an embodiment of the present discloses provides a manufacturing method of a display substrate, the method comprising: providing a base substrate, the base substrate comprising a display zone and a peripheral zone surrounding at least the display zone, the peripheral zone comprising a test bonding zone and a bonding peripheral zone on a side of the display zone, the bonding peripheral zone is located between the test bonding zone and the display zone; forming a sub-pixel unit located within the display zone, comprising: forming a pixel structure, comprising: forming a pixel drive circuit, a first planarization layer, a first relay electrode, a second planarization layer and a light-emitting element, wherein the pixel drive circuit comprises a first display-zone metal layer; the first planarization layer is located on a side of the pixel drive circuit away from the base substrate to provide a first planarization surface, and comprises a first via-hole; the first relay electrode is located on the first planarization surface, and electrically connected with the first display-zone metal layer of the pixel drive circuit through the first via-hole; the second planarization layer is located on a side of the first relay electrode away from the base substrate to provide a second planarization surface, and comprises a second via-hole; and the light-emitting element is located on the second planarization surface and electrically connected with the first relay electrode through the second via-hole; forming a data line in the display zone, the data line being formed to provide a signal to the sub-pixel unit; forming a scan line in the display zone, the scan line being formed to provide a control signal to the sub-pixel unit; forming a plurality of test contact pads in the test bonding zone, wherein each of the plurality of the test contact pads comprises a first test-contact-pad metal layer located on the base substrate and a second test-contact-pad metal layer located on a side of the first test-contact-pad metal layer away from the base substrate, the second test-contact-pad metal layer covers the first test-contact-pad metal layer and contacts the first test-contact-pad metal layer in at least portion of a periphery of the first test-contact-pad metal layer; forming a first peripheral-zone insulating layer in the test bonding zone, wherein the first peripheral-zone insulating layer is formed to expose surfaces of the plurality of the test contact pads facing away from the base substrate and cover at least portion of a periphery of the second test-contact-pad metal layer; forming an auxiliary electrode layer, comprising: forming a plurality of first relay electrode patterns in the test bonding zone and forming a plurality of auxiliary electrodes in the display zone, wherein the plurality of the auxiliary electrodes are located on a side of the sub-pixel unit away from the base substrate, and the plurality of the first relay electrode patterns are located on a side of the first peripheral-zone insulating layer and the plurality of the test contact pads away from the base substrate, wherein the first display-zone metal layer and the first test-contact-pad metal layer are formed by a same first metal material layer, the first relay electrode and the second test-contact-pad metal are formed by a same second metal material layer, the first peripheral-zone insulating layer and the second planarization layer are formed by a same insulating material layer, and the auxiliary electrodes and the first relay electrode patterns are formed by a same conductive material layer.

For example, the manufacturing method of the display substrate provided in at least an embodiment of the present disclosure further comprises: forming an peripheral-zone insulating laminate in the bonding peripheral zone, wherein the peripheral-zone insulating laminate is formed to comprise a plurality of insulating layers, one insulating layer of the at least two insulating layers away from the base substrate expose the other insulating layer of the at least two insulating layers adjacent to the base substrate on a side of the one insulating layer adjacent to the base substrate, so as to form at least two stepped structure on a periphery of the test bonding zone.

For example, in the manufacturing method of the display substrate provided in at least an embodiment of the present disclosure, the peripheral-zone insulating laminate is formed to comprise a first sublayer, a second sublayer and a third sublayer, the third sublayer is formed to be located on a side of the first sublayer away from the base substrate, and the second sublayer is formed to be located between the first sublayer and the third sublayer, wherein the second sublayer is formed to expose the first sublayer on a side of the second sublayer adjacent to the base substrate, and the third sublayer is formed to expose the second sublayer on a side of the third sublayer adjacent to the base substrate, wherein the first sublayer and the first planarization layer are formed by a same insulating material layer; the second sublayer, the second planarization layer and the first peripheral-zone insulating layer are formed by a same first insulating material layer.

For example, in the manufacturing method of the display substrate provided in at least an embodiment of the present disclosure, the second sublayer, the second planarization layer and the first peripheral-zone insulating layer are formed by the same first insulating material layer comprises: after forming the plurality of the test contact pads, the first sublayer and the first relay electrode, depositing a first insulating material layer on the base substrate, patterning the first insulating material layer to allow a portion of the first insulating material layer within the display zone to form the second planarization layer and form the second via-hole in the second planarization layer, removing a portion of the first insulating material layer overlapping the plurality of the test contact pads, thinning a portion of the first insulating material layer located in the test bonding zone and on a periphery of the plurality of the test contact pads to form the first peripheral-zone insulating layer, and removing a portion of the first insulating material layer overlapping an edge of the first sublayer and adjacent to the test bonding zone to expose the first sublayer, and thinning a portion of the first insulating material layer located in the bonding peripheral zone to form the second sublayer.

For example, in the manufacturing method of the display substrate provided in at least an embodiment of the present disclosure, the patterning the first insulating material layer comprises: patterning the first insulating material layer by using a gray-tone or half-tone mask.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIGS. 17A to 17K are a process diagram of a method of manufacturing a display substrate provided in some embodiments of present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Similarly, the terms "a," "an," "the," etc., do not mean a quantity limit, but rather mean that there is at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
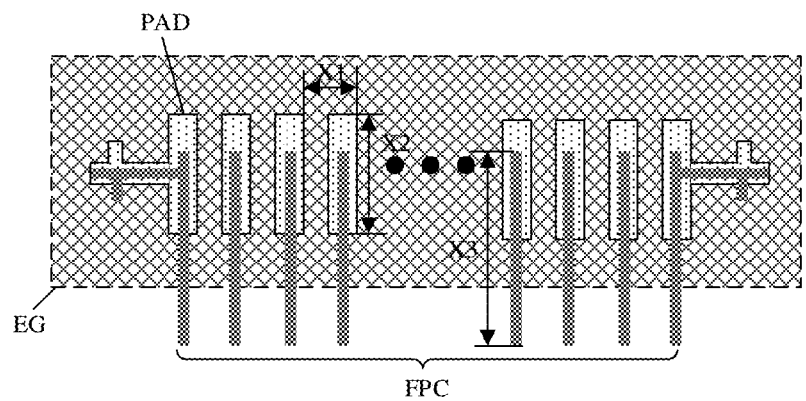
FIG. 1 is a schematic view of bonding test during the lighting test stage.

The display device is detected to screen non-qualified products, thereby improving the product yield. During the product testing of display devices, the test contact pads located within the bonding zone play an important role. For example, FIG. 1 is a schematic view of bonding test during the lighting test stage. As shown in FIG. 1, during the lighting test stage, a detection probe of the FPC (flexible printed circuit) in the test equipment needs to be electrically connected with the test contact pad by pin contact. The length X2 of the test contact pad PAD can be in a range, e.g., from 650 μm to 750 μm. For example, the length X2 of the test contact pad PAD as shown in the figures can be 700 μm. The gap X1 between two test contact pads PAD can be in a range, e.g., from 160 μm to 200 μm. For example, the gap X1 between the two test contact pads PAD as shown in the figures can be 180 μm. However, the length X3 of the detection probe of the FPC can be in a range, e.g., from 1100 μm to 1300 μm. For example, the length X3 of the detection probe of the FPC as shown in the figures can be 1200 μm. Because the length of the detection probe of the FPC is greater than that of the test contact pad PAD, a portion of the probe exceeding the test bonding zone where the test contact pad PAD is located, especially at the boundary EG of the test bonding zone, is prone to arch itself, which will reduce the bonding capacity of the FPC. For saving space, the gap between the two test contact pads PAD is relatively small. If the step difference of the film at which the test contact pad is located is relatively large, the contact between the detection probe and the test contact pad can be affected, causing an increasing risk in the lighting test, which is not conductive to improving the detection efficiency and yield of the products.

To address the above-described problems, at least an embodiment of the present disclosure provides a display substrate. The display substrate comprises a base substrate, a sub-pixel unit, a data line, a scan line, a plurality of the test contact pads and a first peripheral-zone insulating layer. The base substrate comprises a display zone and a peripheral zone, the peripheral zone surrounds at least the display zone and comprises a test bond zone located on a side of the display zone. The sub-pixel unit is located within the display zone and comprises a pixel structure comprising a pixel drive circuit, a first planarization layer, a first relay electrode, a second planarization layer and a light-emitting element. The pixel drive circuit comprises a first display-zone metal layer. The first planarization layer is disposed on a side of the pixel drive circuit away from the base substrate to provide a first planarization surface and comprises a first via-hole. The first relay electrode is disposed on the first planarization surface, and electrically connected with the first display-zone metal layer of the pixel drive circuit through the first via-hole. The second planarization layer is disposed on a side of the first relay electrode away from the base substrate to provide a second planarization surface, and comprises a second via-hole. The light-emitting element is disposed on the second planarization surface, and electrically connected with the first relay electrode by the second via-hole. The data line is located within the display zone, and configured to provide a data signal to the sub-pixel unit. The scan line is located within the display zone, and configured to provide a control signal to the sub-pixel unit. The plurality of the test contact pads are located within the test bonding zone, each of which comprises a first test-contact-pad metal layer and a second test-contact-pad metal layer. The first test-contact-pad metal layer is located on the base substrate; the second test-contact-pad metal layer is located on a side of the first test-contact-pad metal layer away from the base substrate; and the second test-contact-pad metal layer covers the first test-contact-pad metal layer, and contacts the first test-contact-pad metal layer in at least portion of the periphery of the first test-contact-pad metal layer. The first peripheral-zone insulating layer is located within the test bonding zone, and configured to expose the surfaces of the plurality of the test contact pads facing away from the base substrate and cover at least portion of a periphery of the second test-contact-pad metal layer. The first display-zone metal layer and the first test-contact-pad metal layer are arranged in the same layer; the first relay electrode and the second test-contact-pad metal layer are arranged in the same layer; and the first peripheral-zone insulating layer and the second planarization layer are arranged in the same layer.

In the display substrate provided in the above-described embodiments, the second test-contact-pad metal layer covers the first test-contact-pad metal layer and contacts the first test-contact-pad metal layer in at least portion of the periphery of the first test-contact-pad metal layer, which can reduce the step difference of the film at which the test contact pad is located, so that the detection probe can better contact the test contact pads during the lighting test stage, thereby improving the detection efficiency and yield of the products.

At least an embodiment of the present disclosure further provides a display device comprising the above-described display substrate and a method of manufacturing the above-described display substrate.

Embodiments of the present disclosure and examples thereof are described in details with reference to the drawings below.

Figure 2:
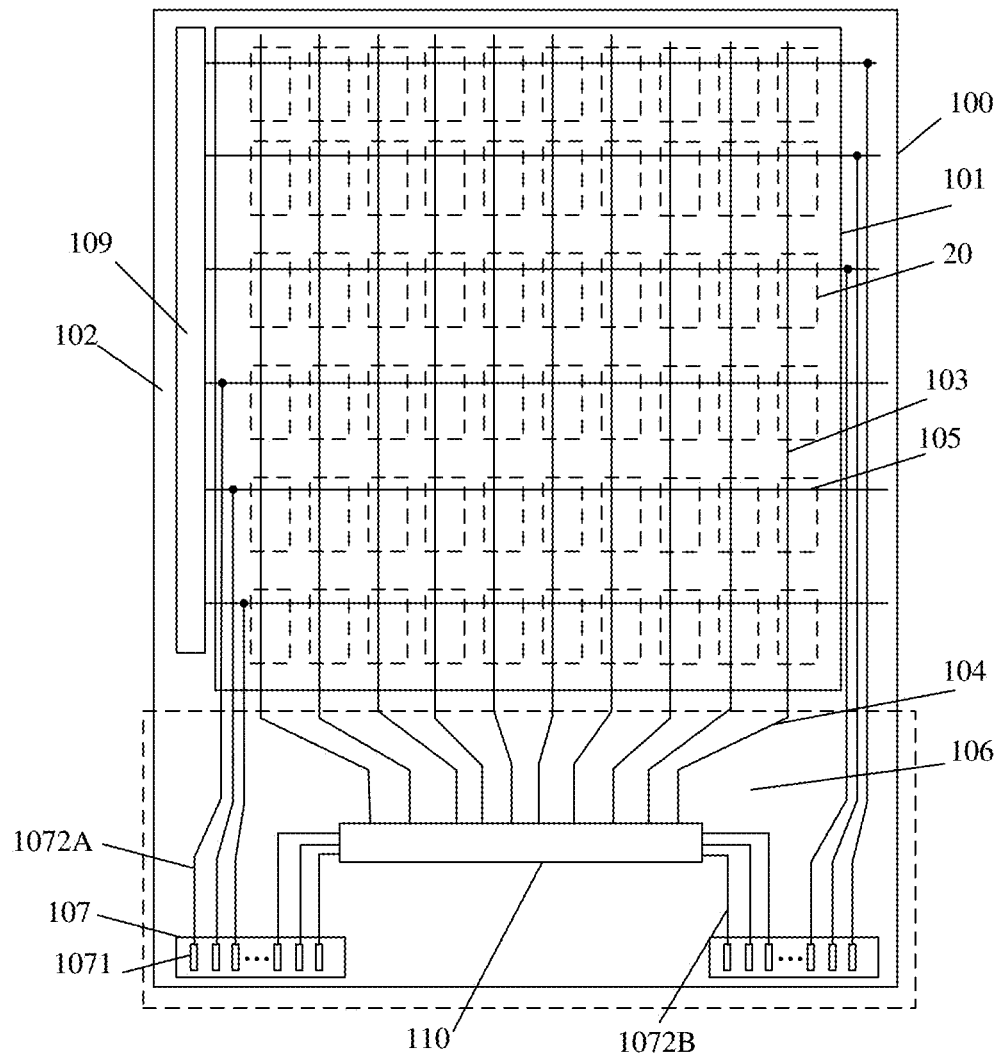
FIG. 2 is a planar view of a display substrate provided in an embodiment of the present disclosure.
Figure 3:
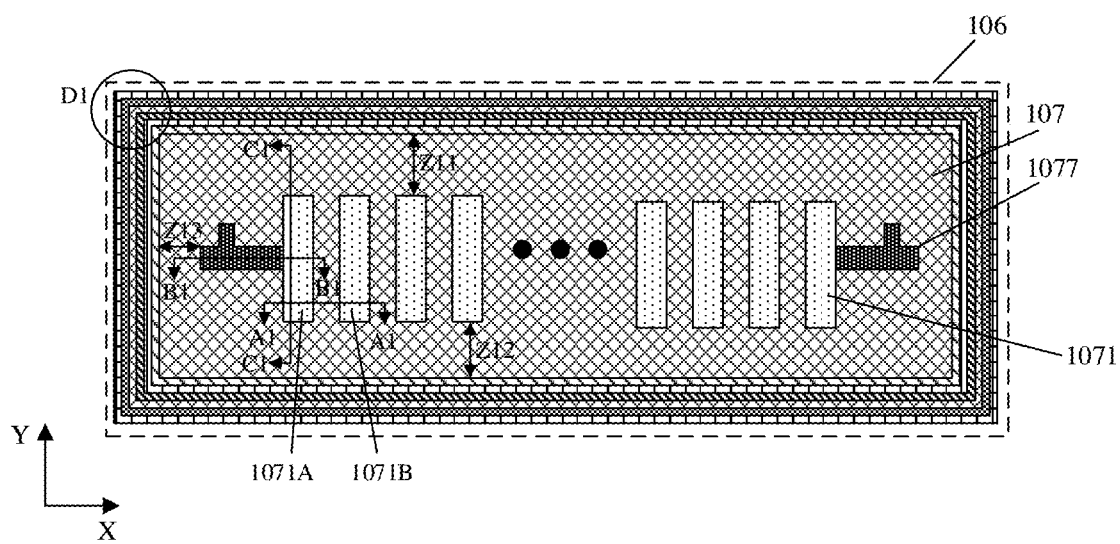
FIG. 3 is a planar view of a bonding peripheral zone and a test bonding zone of a display substrate provided in an embodiment of the present disclosure.

At least an embodiment of the present disclosure provides a display substrate. FIG. 2 is a planar view of a display panel provided in an embodiment of the present disclosure. FIG. 3 is a planar view of a bonding peripheral zone and a test bonding zone of a display substrate provided in an embodiment of the present disclosure. For example, the display substrate is used in organic light-emitting dioxide (OLED) display devices or quantum dot light-emitting diode (QLED) display devices.

For example, as shown in FIG. 2, a display substrate 1 comprises a base substrate 100 comprising a display zone 101 and a peripheral zone 102 surrounding the display zone 101. The peripheral zone 102 comprises a test bonding zone 107 located on a side of the display zone 101 (as shown in FIG. 2, located below the display zone 101). FIG. 2 shows two test bonding zones 107, but the embodiments of the present disclosure are not limited thereto. The test bonding zones 107 comprise a plurality of test contact pads 1071. The test bonding zones 107 are used for bonding to the flexible printed circuit (FPC) of the test equipment during the lighting test stage, allowing the test contact pads 1071 to be electrically connected with the detection probe, thereby performing the lighting test.

For example, the base substrate 100 can be glass, quartz, metal, resin-based plates or the like. For example, the material of the base substrate can comprise organic materials. For example, the organic materials can be polyimides, polycarbonates, polyacrylates, polyetherimines, polyethersulfones, polyethylene terephthalates, polyethylene naphthalates, or other resinous materials. The base substrate 100 can be a flexible or inflexible substrate, and the embodiments of the present disclosure are not limited thereto.

For example, the display substrate 1 further comprises a plurality of sub-pixel units 20 arranged in an array, a plurality of data lines 103, and a plurality of scan lines 105. The data lines 103 and the scan lines 105 are electrically connected with the sub-pixel units 20 to provide a data signal and a gate scanning signal to the sub-pixel units 20. The display substrate 1 further comprises a gate electrode drive circuit 109 located within the peripheral zone 10 and connected with the scan lines 105 so as to provide the gate scanning signal to the sub-pixel units 20 by the scan lines 105.

For example, the display substrate 1 further comprises connection lines 104 located within the peripheral zone 102 and a test unit 110. The connection lines 104 are connected to the data lines 103 and extend to the region where the test unit 110 is located. The test unit 110 is located between the display zone 101 and the test bonding zone 107, and the ends of the connection lines 104 away from the display zone are gathered into the test unit 110. The peripheral zone 102 comprises a first lead 1072A and a second lead 1072B. For example, the test unit can comprise a data selection unit, a test circuit, and the like. One of the plurality of the test contact pads 1071 is electrically connected to the scan line 105 of the display zone 101 via the first lead 1072A; and another of the plurality of the test contact pads 1071 is electrically connected to the test unit 110 via the second lead 1072B, so as to detect the display characteristics of the display zone during the lighting test stage.

For example, in some embodiments of the present disclosure, the display substrate 1 can further comprise a detection line for providing a detection signal, a power line for providing a voltage signal, and the like.

For example, as shown in FIG. 3, the plurality of the test contact pads 1071 are arranged in a row, and the row directions of the plurality of the test contact pads 1071 are parallel to the extension direction of a side edge of the display zone 101 facing towards the test bonding zone 107, that is, the X direction as shown in the figures, so as to minimize the space which the test contact pads 1071 occupy. For example, the arrangement of the plurality of the test contact pads 1071 can vary depending on the size of space of the display substrate 1 and the requirements of the test equipment, and the embodiments of the present disclosure are not limited thereto.

Figure 4A:
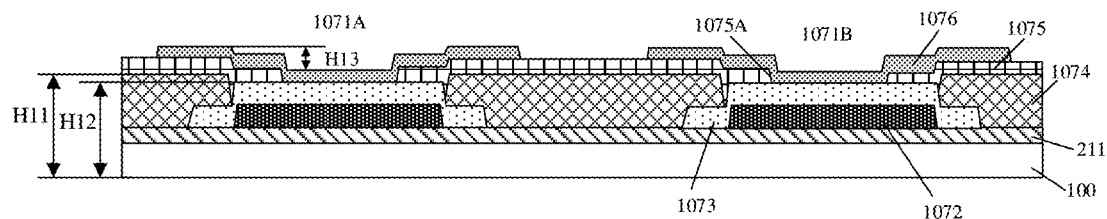
FIG. 4A is a schematic cross-sectional view taken along a section line A1-A1 in FIG. 3.

For example, the section line A1-A1 in FIG. 3 passes through the test contact pads 1071A and the test contact pads 1071B in the X direction, and the section line C1-C1 in FIG. 3 passes through the test contact pads 1071A in the Y direction (parallel to the test contact pads 1071A). FIG. 4A is a schematic cross-sectional view taken along the section line A1-A1; and FIG. 4C is a schematic cross-sectional view taken along the section line C1-C1 in FIG. 3. As shown in FIG. 4A and FIG. 4C, the test contact pad 1071A (1071B) comprises a first test-contact-pad metal layer 1072 located on the base substrate 100, and a second test-contact-pad metal layer 1073 located on a side of the first test-contact-pad metal layer 1072 away from the base substrate 100. The second test-contact-pad metal layer 1073 completely cover the first test-contact-pad metal layer 1072 and contact the first test-contact-pad metal layer 1072 around the periphery of the first test-contact-pad metal layer 1072, thereby avoiding damage of the first test-contact-pad metal layer 1072 caused by the fabrication process of other film layers. Moreover, it can reduce the step difference of the film which the test contact pad is located, so that the detection probe can better contact the test contact pads during the lighting test stage, thereby improve the detection efficiency and yield of the products.

For example, the material of the first test-contact-pad metal layer 1072 and the second test-contact-pad metal layer 1073 can comprise metal materials or alloy materials, such as, a mono-layer or multi-layer metal structure formed by molybdenum, aluminum, titanium, or the like.

For example, as shown in FIG. 3, FIG. 4A and FIG. 4C, the display substrate 1 further comprises a first peripheral-zone insulating layer 1074 located within the test bonding zone 107. The first peripheral-zone insulating layer 1074 is configured to expose a surface of the test contact pad 1071 facing away from the base substrate 100 and cover the periphery of the second test-contact-pad metal layer 1073, thereby avoiding a damage of the second test-contact-pad metal layer 1073 caused by the fabrication process of other film layers.

For example, as shown in FIG. 4A and FIG. 4C, the display substrate 1 further comprises a buffer layer 211 located within the test bonding zone 107 and disposed on a side of the first test-contact-pad metal layer 1072 and the first peripheral-zone insulating layer 1074 adjacent to the base substrate 100. The buffer layer 211 serving as a transition layer can both prevent the invasion of hazardous materials in the base substrate into the interior of the display substrate and increase the adhesion of the film layers in the display substrate to the base substrate 100.

Figure 6:
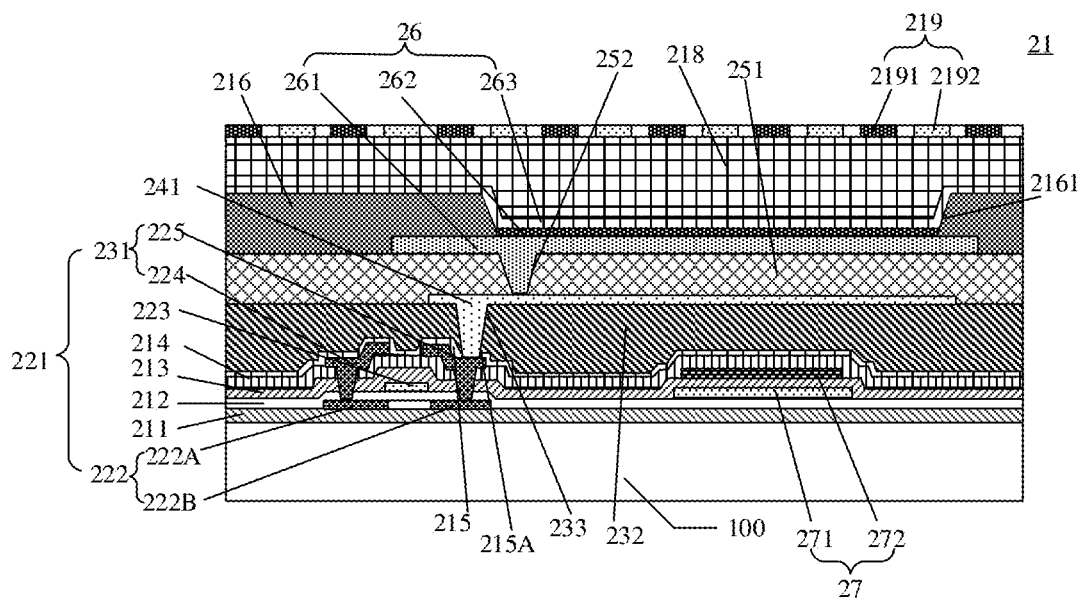
FIG. 6 is a schematic cross-sectional view of a display zone of a display substrate provided in an embodiment of the present disclosure.

FIG. 6 is a schematic cross-sectional view of a display zone of a display substrate provided in an embodiment of the present disclosure. As shown in FIG. 6, each of the plurality of the sub-pixel units in the display zone 101 comprises a pixel structure 21. The pixel structure 21 can comprise a pixel drive circuit 221, a first planarization layer 232, a first relay electrode 241, a second planarization layer 251 and a light-emitting element 26.

For example, as shown in FIG. 6, the pixel structure 21 further comprises a buffer layer 211 located on the base substrate 100 in the display zone 101; and the pixel drive circuit 221 comprises an active layer 222 located on the buffer layer 211, a first gate insulating layer 212 located on a side of the active layer 211 away from the base substrate 100, a gate electrode 223 located on the first gate insulating layer 212, a second gate insulating layer of display zone 213 located on a side of the gate electrode 223 away from the base substrate 100, an interlayer insulating layer 214 located on the second gate insulating layer of display zone 213, and two source-drain electrodes located on the interlayer insulating layer 214 (including a source electrode 224 and a drain electrode 225). The buffer layer 211 in the display zone 101 and the buffer layer 211 in the test bonding zone 107 are the same film layer formed in the same fabrication process. The buffer layer 211 serving as a transition layer can both prevent the invasion of hazardous materials in the base substrate into the interior of display substrate and increase the adhesion of the film layers in the display substrate to the base substrate 100.

For example, the material of the buffer layer 211 can comprise silicon oxide, silicon nitride, silicon oxynitride, or other insulating material. The material of one or more of the interlayer insulating layer 214, the second gate insulating layer 213 and the first gate insulating layer 212 can comprise silicon oxide, silicon nitride, silicon oxynitride, or other insulating material. The material of the interlayer insulating layer 214, the second gate insulating layer 213 and the first gate insulating layer 212 can be the same or different from each other.

For example, as shown in FIG. 6, the active layer 222 can comprise a source electrode zone 222A, a drain electrode zone 222B and a channel region located between the source electrode zone 222A and the drain electrode zone 222B. The interlayer insulating layer 214, the second gate insulating layer 213 and the first gate insulating layer 212 have via-holes to expose the source electrode zone 222A and the drain electrode zone 222B. The source electrode 224 and the drain electrode 225 are electrically connected with the source electrode zone 222A and the drain electrode zone 222B through the via-holes in the interlayer insulating layer 214, the second gate insulating layer 213 and the first gate insulating layer 212, respectively. The gate electrode 223 overlaps with the channel region in the active layer 222 located between the source electrode zone 222A and the drain electrode zone 222B in a direction perpendicular to the base substrate 100.

For example, the first planarization layer 232 is located on a side of the source electrode 224 and the drain electrode 225 away from the base substrate 100, and used to provide a first planarization surface to planarize a surface of the pixel drive circuit 221 away from the base substrate 100. The first planarization layer 232 can planarize an uneven surface caused by the pixel drive circuit 221, and thus prevent the defects in the light-emitting element due to the irregularity caused by the pixel drive circuit 221. A first via-hole 233 is formed in the first planarization layer 232 to expose the source electrode 224 or the drain electrode 225 (as shown in the figures). A first relay electrode 241 is formed on a side of the first planarization layer 232 away from the base substrate 100. The first relay electrode 241 is electrically connected with the drain electrode 225 (or with the source electrode 224) through the first via-hole 233. The first relay electrode 241 can avoid of forming a vertical through-hole with a relative large aperture in the first planarization layer 232, thereby improving the quality of the electrical connection through the vertical through-hole. At the same time, it is also feasible to form the first relay electrode 241 and other signal lines (e.g., power lines, etc.) in the same layer, thereby avoiding the increase of process steps. The first relay electrode 241 and the second test-contact-pad metal layer 1073 of the test contact pad 1071 are arranged in the same layer, and thus the first relay electrode 241 and the second test-contact-pad metal layer 1073 can be formed in the same layer in the fabrication process, e.g., they can be formed with the same layer of material by a patterning process, thereby simplifying the fabrication process.

For example, the material of the first planarization layer 232 comprise silicon oxide, silicon nitride, silicon oxynitride, or other inorganic insulating materials, and may also comprise polyimides, polyphthalimides, polyamides, acrylic resins, benzocyclobutenes or phenolic resins or other organic insulating materials, and the embodiments of the present disclosure are not limited thereto.

For example, the material of the first relay electrode 241 can comprise metal materials or alloy materials, such as, a mono-layer or multi-layer metal structure formed by molybdenum, aluminum, titanium or the like.

For example, the material of the active layer 222 can comprise polycrystalline silicon, or oxide semiconductors (e.g., Indium Gallium Zinc Oxide). The material of the gate electrode 223 can comprise metal materials or alloy materials, such as, a mono-layer or multi-layer metal structure formed by molybdenum, aluminum, titanium, and the like. For example, the multilayer structure is a multilayer metal laminate (such as, a titanium-aluminum-titanium three-layer metal laminate). The material of the source electrode 224 and the drain electrode 225 can comprise metal materials or alloy materials, such as, a mono-layer or multi-layer metal structure formed by molybdenum, aluminum, titanium, and the like. For example, the multilayer structure is a multilayer metal laminate such as, a titanium-aluminum-titanium three-layer metal laminate). Embodiments of the present disclosure do not limit particularly the material of various functional layers.

For example, as shown in FIG. 6, the pixel drive circuit 221 can further comprise a first display-zone metal layer 231. The first display-zone metal layer 231 and the first test-contact-pad metal layer 1072 are arranged in the same layer. The first display-zone metal layer 231 comprises a source electrode 224 and a drain electrode 225 of the pixel drive circuit 221. The source electrode 224, the drain electrode 225 and the first test-contact-pad metal layer 1072 are arranged in the same layer. Thus, the source electrode 224, the drain electrode 225 and the first test-contact-pad metal layer 1072 can be formed in the same layer in the fabrication process, e.g., they can be formed with the same material layer by a patterning process, thereby simplifying the fabrication process and reducing the production cost of the products.

For example, as shown in FIG. 2, the first lead 1072A and the second lead 1072B are formed by the first test-contact-pad metal layer 1072 of the respective test contact pad 1071 extending in a direction towards the display zone 101. The first lead 1072A, the second lead 1072B and the first test-contact-pad metal layer 1072 are formed with the same material by a patterning process.

For example, as shown in FIG. 6, the display substrate 1 further comprises a passivation layer 215 located between the pixel drive circuit 221 and the first planarization layer 232 and comprising a passivation-layer via-hole 215A. The passivation layer 215 can protect the source electrode 224 and the drain electrode 225 of the pixel drive circuit 221 from moisture corrosion. The pixel drive circuit 221 and the first relay electrode 241 are electrically connected with each other further through the passivation-layer via-hole 215A.

For example, the material of the passivation layer 215 can comprise organic insulating materials or inorganic insulating materials, such as silicon nitride material, which can protect the pixel drive circuit 221 from moisture corrosion well due to its high dielectric constant and good hydrophobic function.

For example, as shown in FIG. 6, the second planarization layer 251 is disposed on a side of the first relay electrode 241 away from the base substrate 100, and used to provide a planarization surface on a side of the first relay electrode 241 away from the base substrate 100. Furthermore, a second via-hole 252 is formed in the second planarization layer 251. The second planarization layer 251 and the first peripheral-zone insulating layer 1074 in the test bonding zone 107 are formed in the same layer, and thus the second planarization layer 251 and the first peripheral-zone insulating layer 1074 can be formed in the same layer in the fabrication process, e.g., they can be formed with the same material layer by a patterning process, thereby simplifying the fabrication process.

For example, the material of the second planarization layer 251 comprise silicon oxide, silicon nitride, silicon oxynitride, or other inorganic insulating materials, and can also comprise polyimides, polyphthalimides, polyamides, acrylic resins, benzocyclobutenes or phenolic resins or other organic insulating materials, and the embodiments of the present disclosure are not limited thereto.

For example, still as shown in FIG. 6, the light-emitting element 26 is disposed on the second planarization layer 251, that is, the light-emitting element 26 is disposed on a side of the second planarization layer 251 away from the base substrate 100. The light-emitting element 26 comprises a first electrode 261, a light-emitting layer 262 and a second electrode 263. The first electrode 261 of the light-emitting element 26 is electrically connected with the first relay electrode 241 through the second via-hole 252 in the second planarization layer 251. A pixel definition layer 216 is formed on a side of the first electrode 261 away from the base substrate 100. The pixel definition layer 216 comprises a plurality of openings 2161 for defining a plurality of pixel units. Each of the plurality of openings 2161 exposes the first electrode 261, and the light-emitting layer 262 is disposed in the plurality of openings 2161 of the pixel definition layer 216. The second electrode 263 can for example disposed in a portion or all of the display zone, so that it can be formed on the whole surface in the fabrication process.

For example, the first electrode 261 can comprise a reflective layer, and the second electrode 263 can comprise a transparent layer or a semi-transparent layer. As a result, the first electrode 261 can reflect the light emitted by the light-emitting layer 262, and then the reflected light is emitted through the second electrode 263 to the external environment, thereby improving the light emission efficiency. When the second electrode 263 comprises a semi-transparent layer, some light reflected by the first electrode 261 is reflected again by the second electrode 263, and thus the first electrode 261 and the second electrode 263 form a resonance structure, thereby improving the light emission efficiency.

For example, the material of the first electrode 261 can comprise at least one of transparent conductive oxide materials, including indium tin oxide (ITO), indium zinc oxide (IZO), zinc oxide (ZnO) or the like. Moreover, the first electrode 261 can comprise a metal with high reflectivity as the reflective layer, such as silver (Ag).

For example, with regard to OLEDs, the light-emitting layer 262 can comprise small molecular organic material or polymeric organic material; for example, it can be fluorescent or phosphorescent materials, and can emit red, green, blue, or white light. Furthermore, if required, the light-emitting layer can further comprise an electron injection layer, an electron transfer layer, a hole injection layer, a hole transfer layer or other functional layer(s). With regard to QLEDs, the light-emitting layer can comprise quantum dot materials, e.g., silicon quantum dot, germanium quantum dot, cadmium sulfide quantum dot, cadmium selenide quantum dot, cadmium telluride quantum dot, zinc selenide quantum dot, lead sulfide quantum dot, lead selenide quantum dot, indium phosphide quantum dot and indium arsenide quantum dot or the like. The particle size of the quantum dot is 2-20 nm.

For example, the second electrode 263 can comprise various conductive materials. For example, the second electrode 263 can comprise lithium (Li), aluminum (Al), magnesium (Mg), silver (Ag) or other metal materials.

For example, the material of the pixel definition layer 216 can comprise polyimides, polyphthalimides, polyamides, acrylic resins, benzocyclobutenes or phenolic resins or other organic insulating materials, or the material of the pixel definition layer 216 comprises silicon oxide, silicon nitride or other inorganic insulating materials, and the embodiments of the present disclosure are not limited thereto.

For example, as shown in FIG. 6, the display substrate 1 further comprises a storage capacitor 27. The storage capacitor 27 comprises a first capacitance electrode 271 and a second capacitance electrode 272. The first capacitance electrode 271 is disposed between the first gate insulating layer 212 and the second gate insulating layer 213, and the second capacitance electrode 272 is disposed between the second gate insulating layer 213 and the interlayer insulating layer 214. The first capacitance electrode 271 and the second capacitance electrode 272 are stacked, and at least partly overlap with each other in a direction perpendicular to the base substrate 100. Between the first capacitance electrode 271 and the second capacitance electrode 272, the second gate insulating layer 213 is used as dielectric material, such that the storage capacitor can be formed. The first capacitance electrode 271 and the gate electrode 223 in the pixel drive circuit 221 are arranged in the same layer. Thus, the first capacitance electrode 271 and the gate electrode 223 can be formed in the same layer in the fabrication process, e.g., they can be formed with the same material layer by a patterning process, thereby simplifying the fabrication process and reducing the production cost of the products.

In another example, as a variant of the embodiment as shown in FIG. 6, the first capacitance electrode 271 of the storage capacitor is still arranged in the same layer as the gate electrode 223, while the second capacitance electrode 272 of the storage capacitor are arranged in the same layer as the source electrode 224 and the drain electrode 225 in the pixel drive circuit 221 (i.e., they are also located within the first display-zone metal layer 231), so that a laminated of the second gate insulating layer 213 and the interlayer insulating layer 214, which is between the first capacitance electrode 271 and the second capacitance electrode 272, is used as dielectric material, such that the storage capacitor can be formed.

In still another example, as a variant of the embodiment as shown in FIG. 6, the first capacitance electrode 271 of storage capacitor is not arranged in the same layer as the gate electrode 223, but located between the second gate insulating layer 213 and the interlayer insulating layer 214; the second capacitance electrode 272 of the storage capacitor is arranged in the same layer as the source electrode 224 and the drain electrode 225 in the pixel drive circuit 221 (i.e., they are also located in the first display-zone metal layer 231), so that the interlayer insulating layer 214 between the first capacitance electrode 271 and the second capacitance electrode 272 is used as dielectric material, such that the storage capacitor can be formed.

For example, as shown in FIG. 6, the display substrate 1 further comprises a first display-zone insulating layer 218 located in the display zone 101. The first display-zone insulating layer 218 is disposed on a side of the light-emitting element 26 away from the base substrate 100 to cover the light-emitting element 26, and provides a planarization surface on a side of the light-emitting element 26 away from the base substrate 100.

For example, as shown in FIGS. 4A and 4C, the display substrate 1 further comprises a second peripheral-zone insulating layer 1075 located within the test bonding zone 107. The second peripheral-zone insulating layer 1075 is disposed on a side of the first peripheral-zone insulating layer 1074 and the plurality of the test contact pads 1071 away from the base substrate 100 to cover the first peripheral-zone insulating layer 1074 and the plurality of the test contact pads 1071. The second peripheral-zone insulating layer 1075 has a plurality of first test-contact-pad via-holes 1075A to expose the plurality of the test contact pads 1071, respectively, so as to contact the test contact pad 1071 with the detection probe during the lighting test stage. The second peripheral-zone insulating layer 1075 and the first display-zone insulating layer 218 are arranged in the same layer, and can be formed by the same patterning process.

For example, the materials of the second peripheral-zone insulating layer 1075 and the first display-zone insulating layer 218 can comprise polyimides, polyphthalimides, polyamides, acrylic resins, benzocyclobutenes or phenolic resins or other organic insulating materials, or the materials of the second peripheral-zone insulating layer 1075 and the first display-zone insulating layer 218 comprises silicon oxide, silicon nitride or other inorganic insulating materials, and the embodiments of the present disclosure are not limited thereto.

For example, as shown in FIG. 4A, FIG. 4C and FIG. 6, the display substrate 1 further comprises an auxiliary electrode layer. The auxiliary electrode layer is located in the display zone 101 and the test bonding zone 107. The auxiliary electrode layer comprises a plurality of auxiliary electrodes 219 located within the display zone 101 and on a side of the first display-zone insulating layer 218 away from the base substrate 100. The auxiliary electrodes 219 can be used for other auxiliary functions, e.g., touch function. The auxiliary electrode layer further comprises a plurality of first relay electrode patterns 1076 located within the test bonding zone 107 and on a side of the second peripheral-zone insulating layer 1075 away from the base substrate 100. The plurality of first relay electrode patterns 1076 are electrically connected with the plurality of the test contact pads 1071 through a plurality of first test-contact-pad via-holes 1075A. The plurality of auxiliary electrodes 219 in the display zone 101 and the first relay electrode patterns 1076 in the test bonding zone 107 are arranged in the same layer, and can be formed by the same patterning process.

For example, the auxiliary electrodes 219 for achieving the touch function can be used for achieving a capacitive-type touch structure which can be self-capacitance-type or mutual-capacitance-type. The self-capacitance-type touch structure comprises a plurality of self-capacitance electrodes arranged in an array (located in the same layer), and each of the self-capacitance electrodes is electrically connected with a touch processing circuit (e.g. a touch chip) via a touch lead. By detecting a change in capacitance of the self-capacitance electrode caused by, e.g., the proximity of finger(s) when touching, the position detection is achieved. The mutual-capacitance-type touch structure comprises a plurality of first touch signal lines extending along a first direction and a plurality of second touch signal lines extending along a second direction. The first touch signal lines and the second touch signal lines are both electrically connected with the touch processing circuit (e.g. a touch chip) through touch leads. The first direction and the second direction cross each other so as to form a touch capacitance at the cross site of the first touch signal line and the second touch signal line. By detecting a change in the touch capacitance caused by, e.g., the proximity of finger(s) when touching, the position detection is achieved. The embodiments of the present disclosure are illustrated by taking a mutual-capacitance-type touch structure as example.

As shown in FIG. 6, the mutual-capacitance-type touch structure comprises a first touch signal line 2191 and a second touch signal line 2192 configured to cross each other to achieve the touch function of the display substrate. In the touch structure, the first touch signal line 2191 and the second touch signal line 2192 can be disposed in the same layer, e.g., the first touch signal line 2191 comprises a plurality of subsections, while the second touch signal line 2192 is continuous. At the site where the first touch signal line 2191 and the second touch signal line 2192 cross each other, a bridging electrode (not shown) is provided, which is located in a layer different from that of the first touch signal line 2191 and the second touch signal line 2192 to allow the two adjacent subsections of the first touch signal lines 2191 to be electrically connected with each other. By arranging the first touch signal line 2191 and the second touch signal line 2192, it is feasible to increase the touch sensitivity of the display substrate. The first relay electrode patterns 1076 can be formed with the same material as one of the first touch signal line 2191 and the second touch signal line 2192 by using the same patterning process.

For example, the material for forming the auxiliary electrodes 219 can comprise indium tin oxide (ITO), and thus produces a transparent electrode. Alternatively, the materials for forming the auxiliary electrodes 219 can comprise a metal mesh, and thus produces a transparent electrode.

Figure 4B:
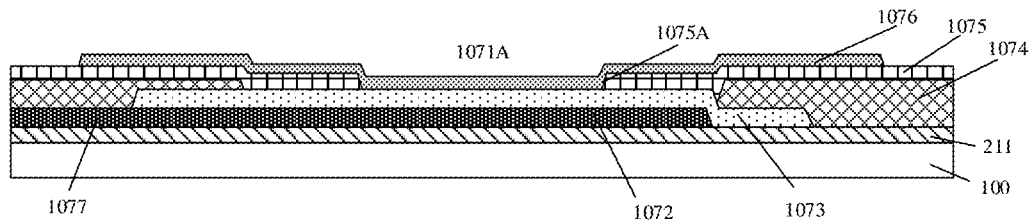
FIG. 4B is a schematic cross-sectional view taken along a section line B1-B1 in FIG. 3.
Figure 4C:
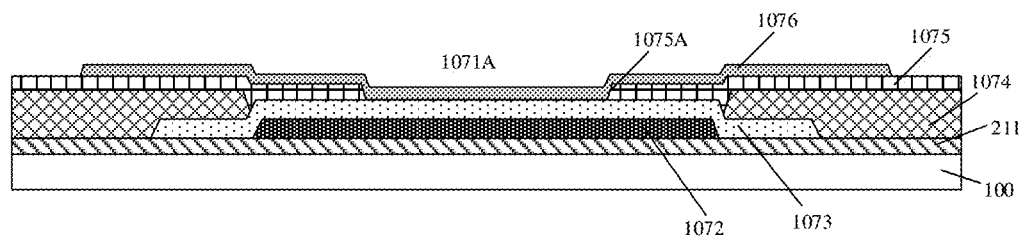
FIG. 4C is a schematic cross-sectional view taken along a section line C1-C1 in FIG. 3.

For example, as shown in FIG. 3 and FIG. 4B, the display substrate 1 further comprises a marker metal layer 1077. The section line B1-B1 in FIG. 3 passes through the test contact pad 1071A and the marker metal layer 1077 in the X direction, and FIG. 4B shows a schematic cross-sectional view taken along the section line B1-B1 in FIG. 3. The marker metal layer 1077 are located at the edges adjacent to both sides of the test bonding zone 107, and is electrically connected with the first test-contact-pad metal layer 1072 of the test contact pad 1071 at the edges of the test bonding zone 107. The marker metal layer 1077 is located on a side of the first peripheral-zone insulating layer 1074 adjacent to the base substrate 100, and are arranged in the same layer as the first test-contact-pad metal layer 1072. The marker metal layer 1077 is used to align the test contact pad 1071 with the detection probe of the FPC during the bond test stage, followed by bonding the detection probe and the test contact pad 1071 together.

For example, in FIG. 3, Z11 is a distance extends upwards (along the arrow direction of Y in FIG. 3) from the boundary of the first peripheral-zone insulating layer 1074 exposing the test contact pad 1071 to the boundary of the test bonding zone 107 parallel to an arrangement direction of the test contact pad 1071. Z12 is a distance extends downwards (along a direction opposed to the arrow direction of Y in FIG. 3) from the boundary of the first peripheral-zone insulating layer 1074 exposing the test contact pad 1071 to the boundary of the test bonding zone 107 parallel to an arrangement direction of the test contact pad 1071. Z13 is a distance of the first peripheral-zone insulating layer 1074 extends from a side of the marker metal layer 1077 adjacent to the boundary of the test bonding zone 107 to the boundary of the test bonding zone 107. For example, the distance Z11 can be in a range of greater than or equal to 100 μm, the distance Z12 can be in a range of greater than or equal to 200 μm, and the distance Z13 can be in a range of greater than or equal to 100 μm. In this way, it is feasible to efficiently decrease the film height difference between the detection probe and the detection probe, reducing the risk of the lighting test, and improve the detection efficiency and yield of the display substrate.

Figure 4D:
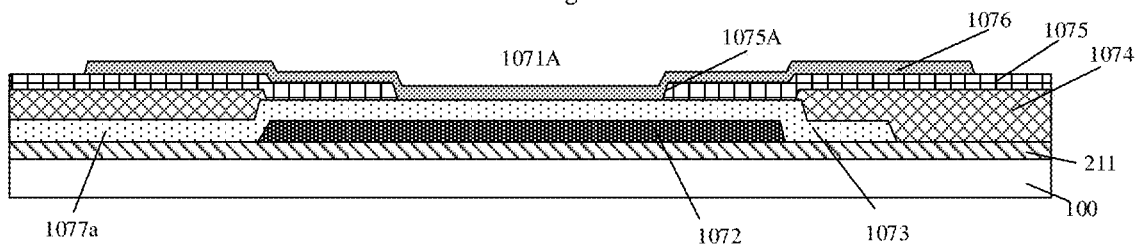
FIG. 4D is another schematic cross-sectional view taken along a section line B1-B1 in FIG. 3.

For example, in other embodiments, FIG. 4D is another schematic cross-sectional view taken along a section line B1-B1 in FIG. 3. As shown in FIG. 4D, the display substrate 1 comprises a marker metal layer 1077a, which is different from the marker metal layer 1077 as shown in FIG. 4B in that: the marker metal layer 1077a is not arranged in the same layer as the first test-contact-pad metal layer 1072. For example, the marker metal layer 1077a is formed by extending the second test-contact-pad metal layer 1073 towards to the edges of the test bonding zone 107. Because the second test-contact-pad metal layer 1073 covers the first test-contact-pad metal layer 1072, the height of the second test-contact-pad metal layer 1073 relative to the base substrate 100 in a direction perpendicular to the base substrate 100 is greater that the height of the marker metal layer 1077a relative to the base substrate 100 in the direction perpendicular to the base substrate 100. The marker metal layer 1077a can be arranged in the same layer as the second test-contact-pad metal layer 1073 and formed in the same patterning process. The material of the marker metal layer 1077a can be the same as that of the second test-contact-pad metal layer 1073.

It should be indicated that the marker metal layer 1077a can also be arranged in a different layer from the second test-contact-pad metal layer 1073, that is, the marker metal layer 1077a can also be an independent metal layer. The embodiments of the present disclosure are not limited to the arrangement mode of the marker metal layer. For example, as shown in FIG. 4A, a vertical distance between the surface of the first peripheral-zone insulating layer 1074 away from the base substrate 100 and the base substrate 100 is H11, and a vertical distance between the surface of the test contact pad 1071 away from the base substrate 100 and the base substrate 100 is H12. For example, H11 is slightly greater than H12.

For example, in FIG. 4A, the second test-contact-pad metal layer 1073 covers the first test-contact-pad metal layer 1072 to reduce the step difference H13 of the film which the test contact pad is located. For example the step difference H13 is a distance between the surface of the first relay electrode patterns 1076 above the test contact pad 1071 away from the base substrate 100 and the surface of the first relay electrode patterns 1076 at the periphery of the test contact pad 1071 away from the base substrate 100 in a direction perpendicular and the base substrate 100. For example, the step difference H13 can be in a range of 1.0 μm to 1.5 μm, e.g., the step difference H13 (in FIG. 4A) can be about 1.23 μm. The term "about" means that the step difference H13 can vary in the range of, for example "±15%", of its value. The reduction of the step difference H13 can increase the bonding capacity of the test detection and the test contact pad, which is beneficial for the detection efficiency and yield of the products.

Figure 5A:
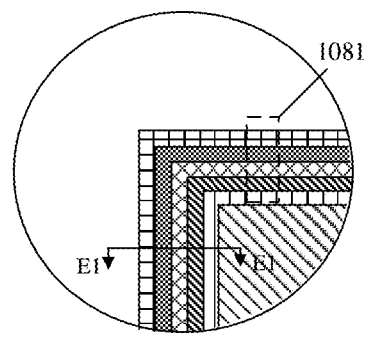
FIG. 5A is an enlarged schematic view of a zone D1 in FIG. 3.
Figure 5B:
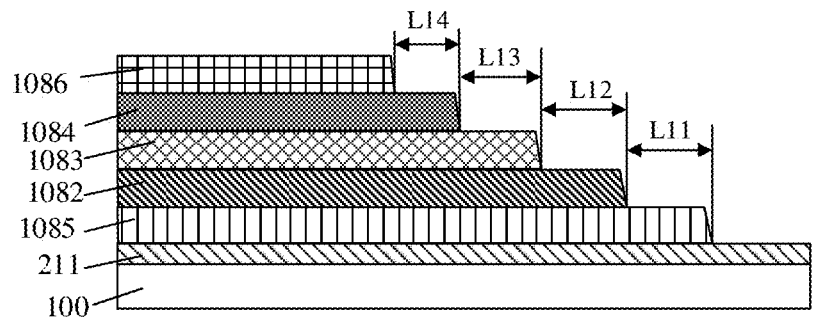
FIG. 5B is a schematic cross-sectional view taken along a section line E1-E1 in FIG. 5A.

For example, in some embodiments, FIG. 5A is an enlarged schematic view of a zone D1 in FIG. 3; and FIG. 5B is a schematic cross-sectional view taken along a section line E1-E1 in FIG. 5A. As shown in FIG. 3, FIG. 5A and FIG. 5B, the peripheral zone 102 further comprises a bonding peripheral zone 106 surrounding the test bonding zone 107.

For example, as shown in FIG. 5A and FIG. 5B, the display substrate further comprises a peripheral-zone insulating laminate 1081. The peripheral-zone insulating laminate 1081 is disposed on the base substrate 100 and located within the bonding peripheral zone 106, and surrounds the test bonding zone 107. For example, the bonding peripheral zone 106 further comprises a buffer layer 211 located between the peripheral-zone insulating laminate 1081 and the base substrate 100. The buffer layer 211 in the bonding peripheral zone 106, the buffer layer 211 in the display zone 101, and the buffer layer 211 in the test bonding zone 107 are the same film layer formed in the same fabrication process.

For example, in some embodiments, the peripheral-zone insulating laminate comprises a plurality of insulating layers, for example, comprises at least two insulating layers. One of the at least two insulating layers away from the base substrate exposes the other of the at least two insulating layers adjacent to the base substrate on a side of the one of the at least two insulating layers adjacent to the base substrate, so as to form at least two stepped structure on the periphery of the test bonding zone. As shown in FIG. 5A and FIG. 5B, the peripheral-zone insulating laminate 1081 comprises a first sublayer 1082, a second sublayer 1083 and a third sublayer 1084 which are sequentially laminated on the base substrate 100. The third sublayer 1084 is located on a side of the first sublayer 1082 away from the base substrate 100, and the second sublayer 1083 is located between the first sublayer 1082 and the third sublayer 1084. The second sublayer 1083 exposes the first sublayer 1082 on a side of the second sublayer 1083 adjacent to the base substrate 100, the third sublayer 1084 exposes the second sublayer 1083 on a side of the third sublayer 1084 adjacent to the base substrate 100 to allow the peripheral-zone insulating laminate 1081 to form a multiple-stepped structure, so that the detection probe of the FPC is not prone to arch itself at the boundary EG of the test bonding zone, thereby improving the bonding capacity of the detection probe and the test contact pad.

For example, in some embodiments, the first sublayer 1082 and the first planarization layer 232 of the pixel structure 21 in FIG. 6 are arranged in the same layer. Thus, the first sublayer 1082 and the first planarization layer 232 can be formed in the same layer in the fabrication process, e.g., they can be formed with the same material layer by a patterning process, thereby simplifying the fabrication process. The second sublayer 1083 and the second planarization layer 251 of the pixel structure 21 in FIG. 6 are arranged in the same layer. Thus, the second sublayer 1083 and the second planarization layer 251 can be formed in the same layer in the fabrication process, e.g., they can be formed with the same material layer by a patterning process, thereby simplifying the fabrication process. The third sublayer 1084 and the pixel definition layer 216 of the pixel structure 21 in FIG. 6 are arranged in the same layer. Thus, the third sublayer 1084 and the pixel definition layer 216 can be formed in the same layer in the fabrication process, e.g., they can be formed with the same material layer by a patterning process, thereby simplifying the fabrication process.

For example, as shown in FIG. 5A and FIG. 5B, the first sublayer 1082 exposed by the second sublayer 1083 on the periphery of the test bonding zone 107 has a length of L12. For example, L12 can be in a range of 8 µm to 12 µm, e.g., L12 can be about 10 µm. Here, the term "about" means that L13 can vary in the range, for example "±15%" of its value. The second sublayer 1082 exposed by the third sublayer 1084 on the periphery of the test bonding zone 107 has a length of L13. For example, L13 can be in a range of 8 µm to 12 µm, e.g., L13 can be about 10 µm. Here, the term "about" means that L13 can vary in the range, for example "±15%" of its value. In other embodiments, the values of L12 and L13 can be selected depending on the length of the detection probe and the length of the test contact pad.

For example, in some embodiments, as shown in FIG. 5A and FIG. 5B, the peripheral-zone insulating laminate 1081 further comprises a fourth sublayer 1085 located on a side of the first sublayer 1082 adjacent to the base substrate 100, that is, the fourth sublayer 1085 is located between the first sublayer 1082 and the buffer layer 211. The first sublayer 1082 exposes the fourth sublayer 1085 on a side of the first sublayer 1082 adjacent to the base substrate 100 so that the fourth sublayer 1085, the first sublayer 1082, the second sublayer 1083 and the third sublayer 1084 form a multi-stepped structure.

For example, the fourth sublayer 1085 and the passivation layer 215 of the pixel structure 21 in FIG. 6 are arranged in the same layer. Thus, the fourth sublayer 1085 and the passivation layer 215 can be formed in the same layer in the fabrication process, e.g., they can be formed with the same material layer by a patterning process, thereby simplifying the fabrication process.

For example, the fourth sublayer 1085 exposed by the first sublayer 1082 on the periphery of the test bonding zone 107 has a length of L11. For example, L11 can be in a range of 8 µm to 12 µm, e.g., L11 can be about 10 µm. Here, the term "about" means that L11 can vary in the range, for example "±15%" of its value. In other embodiments, L11 can be selected depending on the length of the detection probe and the length of the test contact pad.

For example, in some embodiments, as shown in FIG. 5A and FIG. 5B, the peripheral-zone insulating laminate 1081 further comprises a fifth sublayer 1086 located on a side of the third sublayer 1084 away from the base substrate 100. The fifth sublayer 1086 exposes the third sublayer 1084 on a side of the fifth sublayer 1086 adjacent to the base substrate 100 so that the fourth sublayer 1085, the first sublayer 1082, the second sublayer 1083, the third sublayer 1084 and the fifth sublayer 1086 form a multi-stepped structure.

For example, the fifth sublayer 1086 and the passivation layer 218 of the pixel structure 21 in FIG. 6 are arranged in the same layer. Thus, the fifth sublayer 1086 and the display zone insulating layer 218 can be formed in the same layer in the fabrication process, e.g., they can be formed with the same material layer by a patterning process, thereby simplifying the fabrication process.

For example, the third sublayer 1084 exposed by the fifth sublayer 1086 on the periphery of the test bonding zone 107 has a length of L14. For example, L14 can be in a range of 8 µm to 12 µm, e.g., L14 can be about 10 µm. Here, the term "about" means that L14 can vary in the range, for example "±15%" of its value. In other embodiments, the value of L14 can be selected depending on the length of the detection probe and the length of the test contact pad.

Figure 7:
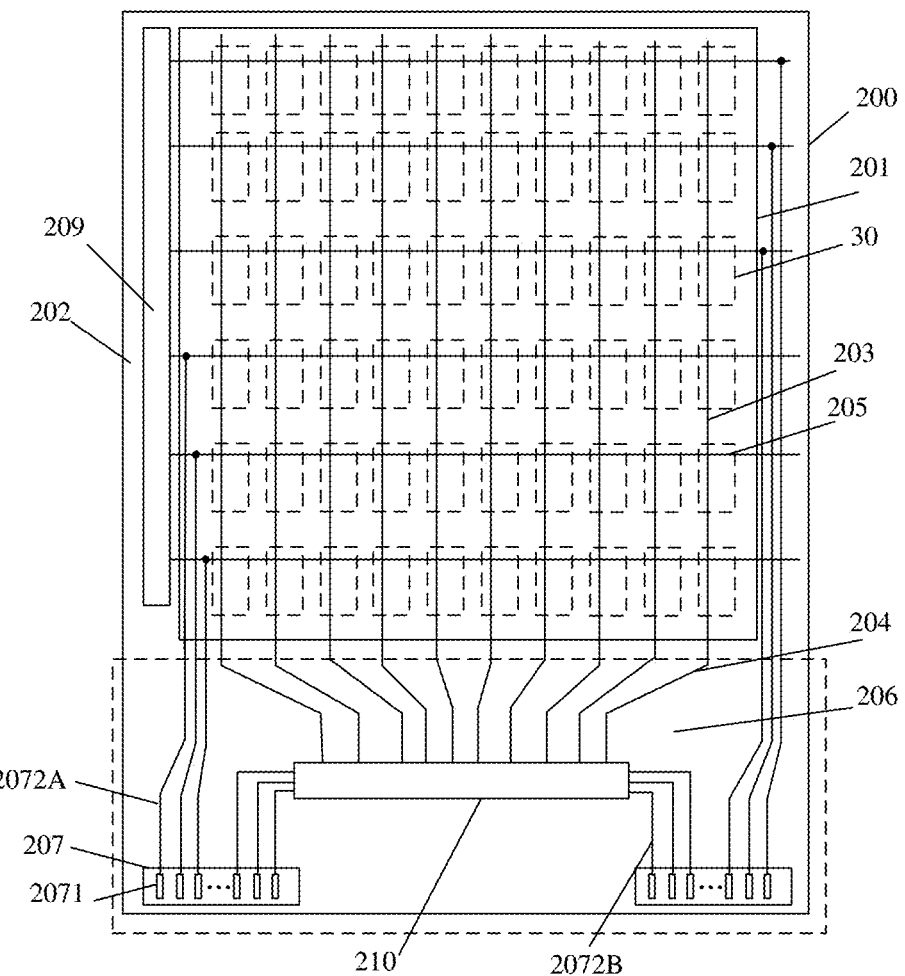
FIG. 7 is a planar view of another display substrate provided in an embodiment of the present disclosure.
Figure 8:
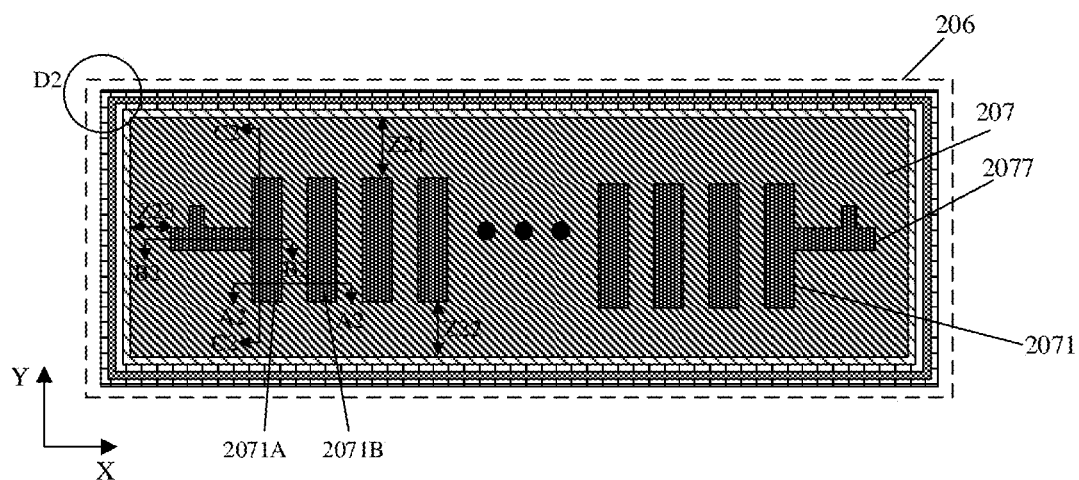
FIG. 8 is a planar view of a bonding peripheral zone and a test bonding zone of another display substrate provided in an embodiment of the present disclosure.

At least an embodiment of the present disclosure further provides another display substrate. FIG. 7 is a planar view of another display substrate provided in an embodiment of the present disclosure, and FIG. 8 is a planar view of a bonding peripheral zone and a test bonding zone of another display substrate provided in an embodiment of the present disclosure. For example, the display substrate is used in organic light-emitting dioxide (OLED) display devices or quantum dot light-emitting diode (QLED) display devices.

For example, as shown in FIG. 7, a display substrate 2 comprises a base substrate 200, and the base substrate 200 comprises a display zone 201 and a peripheral zone 202 surrounding the display zone 201. The peripheral zone 202 comprises a test bonding zone 207 located on a side of the display zone 201 (as shown in FIG. 7, located below the display zone 201). FIG. 7 shows two test bonding zones 207, but the embodiments of the present disclosure are not limited thereto. The test bonding zone 207 comprises a plurality of test contact pads 2071. The test bonding zone 207 is used for bonding to the flexible printed circuit (FPC) of the test equipment during the lighting test stage, allowing the test contact pad 2071 to be electrically connected with the detection probe, thereby performing the lighting test.

For example, the base substrate 200 can be glass, quartz, metal, resin-based plates or the like. For example, the material of the base substrate can comprise organic materials. For example, the organic materials can be polyimides, polycarbonates, polyacrylates, polyetherimines, polyethersulfones, polyethylene terephthalates, polyethylene naphthalates, or other resinous materials. The base substrate 200 can be a flexible or inflexible substrate, and the embodiments of the present disclosure are not limited thereto.

For example, the display substrate 2 further comprises a plurality of sub-pixel units 30 arranged in an array and located within the display zone 201, a plurality of data lines 203, and a plurality of scan lines 205. The data lines 203 and the scan lines 205 are electrically connected with the sub-pixel units 30 to provide a data signal and a gate scanning signal for the sub-pixel units 30. The display substrate 2 further comprises a gate electrode drive circuit 209 located within the peripheral zone 202. The gate electrode drive circuit 209 is connected with the scan lines 205 to provide a gate scan signal to the sub-pixel units 30 through the scan lines 205.

For example, the display substrate 2 further comprises connection lines 204 located within the peripheral zone 202 and a test unit 210. The connection lines 204 are connected to the data lines 203 and extend to the region where the test unit 210 is located. The test unit 210 is located between the display zone 201 and the test bonding zone 207, and the ends of the connection lines 204 away from the display zone are gathered into the test unit 210. The peripheral zone 202 comprises a first lead 2072A and a second lead 2072B. For example, the test unit 210 can comprise a data selection unit, a test circuit, and the like. One of the plurality of the test contact pads 2071 is electrically connected to the scan line 205 of the display zone 201 via the first lead 2072A; and another of the plurality of the test contact pads 2071 is electrically connected to the test unit 210 via the second lead 2072B, so as to test the display characteristics of the display zone during the lighting test stage.

For example, in some embodiments of the present disclosure, the display substrate 2 can further comprise a detection line for providing a detection signal, a power line for providing a voltage signal, and the like.

For example, as shown in FIG. 8, the plurality of the test contact pads 2071 are arranged in a row, and a row direction of the plurality of the test contact pads 2071 is parallel to the extension direction of a side edge of the display zone 201 facing towards the test bonding zone 207, that is, the X direction as shown in the figures, so as to minimize the space which the test contact pads 2071 occupy. For example, the arrangement of the plurality of the test contact pads 2071 can vary depending on the size of space of the display substrate 2 and the requirements of the test equipment, and the embodiments of the present disclosure are not limited thereto.

Figure 9A:
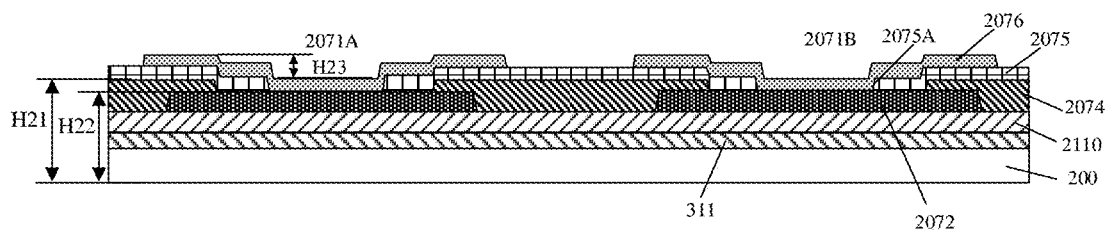
FIG. 9A is a schematic cross-sectional view taken along a section line A2-A2 in FIG. 8.

For example, the section line A2-A2 in FIG. 8 passes through the test contact pad 2071A and the test contact pad 2071B in the X direction, and the section line C2-C2 in FIG. 8 passes through the test contact pad 2071A in the Y direction (parallel to the test contact pad 2071A). FIG. 9A is a schematic cross-sectional view taken along a section line A2-A2 in FIG. 8; and FIG. 9C is a schematic cross-sectional view taken along a section line C2-C2 in FIG. 8. As shown in FIG. 9A and FIG. 9C, the test contact pad 2071A (2071B) comprises a first test-contact-pad metal layer 2072 located on the base substrate 200. For example, the material of the first test-contact-pad metal layer 2072 can comprise metal materials or alloy materials, such as, a mono-layer or multi-layer metal structure formed by molybdenum, aluminum, titanium, or the like.

For example, as shown in FIG. 8, FIG. 9A and FIG. 9C, the display substrate 2 further comprises a first peripheral-zone insulating layer 2074, the first peripheral-zone insulating layer 2074 is located within the test bonding zone 207 and configured to expose a surface of the test contact pad 2071 facing away from the base substrate 200 and cover the periphery of the second test-contact-pad metal layer 2072, thereby avoiding a damage of the second test-contact-pad metal layer 2072 caused by the fabrication process of other film layers. Moreover, it can reduce the step difference of the film at which the test contact pad is located, so that the detection probe can better contact the test contact pad during the lighting test stage, thereby improving the detection efficiency and yield of the products.

For example, as shown in FIG. 9A and FIG. 9C, the display substrate 2 further comprises a bonding-zone interlayer insulating layer 2110 located within the test bonding zone 207. The bonding-zone interlayer insulating layer 2110 is located on a side of the first test-contact-pad metal layer 2072 and the first peripheral-zone insulating layer 2074 adjacent to the base substrate 200.

For example, as shown in FIG. 9A and FIG. 9C, the display substrate 2 further comprises a buffer layer 311 located within the test bonding zone 207 and disposed between the bonding-zone interlayer insulating layer 2110 and the base substrate 200. The buffer layer 311 serving as a transition layer can both prevent the invasion of hazardous materials in the base substrate into the interior of display substrate and increase the adhesion of the film layers in the display substrate to the base substrate 200.

Figure 11:
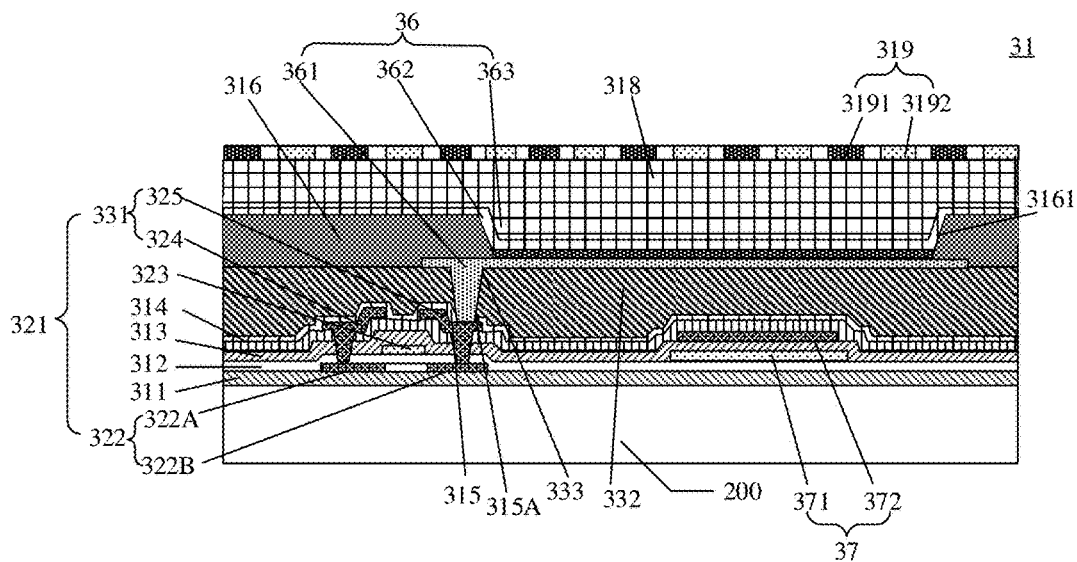
FIG. 11 is a schematic cross-sectional view of a display zone of a display substrate provided in another embodiment of the present disclosure.

FIG. 11 is a schematic cross-sectional view of a display zone of a display substrate provided in an embodiment of the present disclosure. As shown in FIG. 11, each of the plurality of the sub-pixel units in the display zone 201 comprises a pixel structure 31. The pixel structure 31 can comprise a pixel drive circuit 321, a first planarization layer 332 and a light-emitting element 36.

For example, as shown in FIG. 11, the pixel structure 31 further comprises a buffer layer 311 located on the base substrate 200 in the display zone 201. The pixel drive circuit 321 comprises an active layer 322 located on the buffer layer 311, a first gate insulating layer 312 located on a side of the active layer 311 away from the base substrate 200, a gate electrode 323 located on the first gate insulating layer 312, a second gate insulating layer 313 of display zone located on a side of the gate electrode 323 away from the base substrate 200, an interlayer insulating layer 314 located on the second gate insulating layer 313, and two source-drain electrodes (including a source electrode 324 and a drain electrode 325) located on the interlayer insulating layer 314. The buffer layer 311 in the display zone 201 and the buffer layer 311 in the test bonding zone 207 are the same film layer formed in the same fabrication process. The buffer layer 311 serving as a transition layer can both prevent the invasion of hazardous materials in the base substrate 200 into the interior of display substrate and increase the adhesion of the film layers in the display substrate to the base substrate 200.

For example, the material of the buffer layer 311 can comprise silicon oxide, silicon nitride, silicon oxynitride, or other insulating materials. The material of one or more of the interlayer insulating layer 314, the second gate insulating layer 313 and the first gate insulating layer 312 can comprise silicon oxide, silicon nitride, silicon oxynitride, or other insulating materials. The materials of the interlayer insulating layer 314, the second gate insulating layer 313 and the first gate insulating layer 312 can be the same or different from one another.

For example, as shown in FIG. 11, the active layer 322 can comprise a source electrode zone 322A, a drain electrode zone 322B and a channel region located between the source electrode zone 322A and the drain electrode zone 322B. The interlayer insulating layer 314, the second gate insulating layer 313 and the first gate insulating layer 312 have via-holes to expose the source electrode zone 322A and the drain electrode zone 322B. The source electrode 324 and the drain electrode 325 are electrically connected with the source electrode zone 322A and the drain electrode zone 322B through the via-holes in the interlayer insulating layer 314, the second gate insulating layer 313 and the first gate insulating layer 312, respectively. The gate electrode 323 overlaps with the channel region in the active layer 322 located between the source electrode zone 322A and the drain electrode zone 322B in a direction perpendicular to the base substrate 200. The bonding-zone interlayer insulating layer 2110 in the test bonding zone 207 and the interlayer insulating layer 314 are arranged in the same layer. Thus, the bonding-zone interlayer insulating layer 2110 and the interlayer insulating layer 314 are formed in the same layer in the fabrication process, e.g., they can be formed with the same material layer by a patterning process, thereby simplifying the fabrication process.

For example, the first planarization layer 332 is located on a side of the source electrode 324 and the drain electrode 325 away from the base substrate 200, and used to provide a first planarization surface to planarize a surface of the pixel drive circuit 321 away from the base substrate 200. The first planarization layer 332 can planarize an uneven surface caused by the pixel drive circuit 321, and thus prevent the defects in the light-emitting element due to the irregularity caused by the pixel drive circuit 321. A first via-hole 333 is formed in the first planarization layer 332 to expose the source electrode 324 or the drain electrode 325 (as shown in the figures). The first planarization layer 332 and the first peripheral-zone insulating layer 2074 in the test bonding zone 207 are formed in the same layer, and thus the first planarization layer 332 and the first peripheral-zone insulating layer 2074 can be formed in the same layer in the fabrication process, e.g., they can be formed with the same material layer by a patterning process, thereby simplifying the fabrication process.

For example, the material of the first planarization layer 332 comprise silicon oxide, silicon nitride, silicon oxynitride, or other inorganic insulating materials, and can also comprise polyimides, polyphthalimides, polyamides, acrylic resins, benzocyclobutenes or phenolic resins or other organic insulating materials, and the embodiments of the present disclosure are not limited thereto.

For example, the material of the active layer 322 can comprise polycrystalline silicon, or oxide semiconductors (e.g., Indium Gallium Zinc Oxide). The material of the gate electrode 323 can comprise metal materials or alloy materials, such as, a mono-layer or multi-layer metal structure formed by molybdenum, aluminum, titanium, and the like. For example, the multilayer structure is a multilayer metal laminate (such as, a titanium-aluminum-titanium three-layer metal laminate). The material of the source electrode 324 and the drain electrode 325 can comprise metal materials or alloy materials, such as, a mono-layer or multi-layer metal structure formed by molybdenum, aluminum, titanium, and the like. For example, the multilayer structure is a multilayer metal laminate such as, a titanium-aluminum-titanium three-layer metal laminate). Embodiments of the present disclosure do not limit particularly the material of various functional layers.

For example, as shown in FIG. 11, the pixel drive circuit 321 can further comprise a first display-zone metal layer 331. The first display-zone metal layer 331 and the first test-contact-pad metal layer 2072 are arranged in the same layer. The first display-zone metal layer 331 comprises a source electrode 324 and the drain electrode 325 of the pixel drive circuit 321. The source electrode 324 and the drain electrode 325 and the first test-contact-pad metal layer 2072 are arranged in the same layer. Thus, the source electrode 324 and the drain electrode 325 and the first test-contact-pad metal layer 2072 can be formed in the same layer in the fabrication process, e.g., they can be formed with the same material layer by a patterning process, thereby simplifying the fabrication process and reducing the production cost of the products.

For example, as shown in FIG. 7, the first lead 2072A and the second lead 2072B are formed by the first test-contact-pad metal layer 2072 of the respective test contact pad 2071 extending in a direction towards the display zone 201. The first lead 2072A and the second lead 2072B and the first test-contact-pad metal layer 2072 are formed with the same material by a patterning process.

For example, as shown in FIG. 11, the display substrate 2 further comprises a passivation layer 315 located between the pixel drive circuit 321 and the first planarization layer 332 and comprising a passivation-layer via-hole 315A. The passivation layer 315 can protect the source electrode and the drain electrode of the pixel drive circuit 321 from moisture corrosion.

For example, the material of the passivation layer 315 can comprise organic insulating materials or inorganic insulating materials, such as, silicon nitride materials, which can protect the pixel drive circuit from moisture corrosion well due to its high dielectric constant and good hydrophobic function.

For example, still as shown in FIG. 11, the light-emitting element 36 is disposed on the first planarization layer 332, that is, the light-emitting element 36 is disposed on a side of the first planarization layer 332 away from the base substrate 200. The light-emitting element 36 comprises a first electrode 361, a light-emitting layer 362 and a second electrode 363. The first electrode 361 of the light-emitting element 36 is electrically connected with one of the source electrode and the drain electrode (the source electrode 324 or the drain electrode 325) through the first via-hole 333 in the first planarization layer 332 and the passivation-layer via-hole 315A in the passivation layer 315. A pixel definition layer 316 is formed on a side of the first electrode 361 away from the base substrate 200 and comprises a plurality of openings 3161 to define a plurality of pixel units. Each of the plurality of the openings 3161 exposes the first electrode 361, and the light-emitting layer 362 is disposed in the plurality of the openings 3161 of the pixel definition layer 316. The second electrode 363 can be, e.g., disposed in a portion or all of the display zone, so that it can be formed on the whole surface in the fabrication process.

For example, the first electrode 361 can comprise a reflective layer, and the second electrode 363 can comprise a transparent layer or a semi-transparent layer. As a result, the first electrode 361 can reflect a light emitted by the light-emitting layer 362, which is emitted through the second electrode 363 to the external environment, thereby improving the light emitting efficiency. When the second electrode 363 comprises a semi-transparent layer, some light reflected by the first electrode 361 is reflected again by the second electrode 363, and thus the first electrode 361 and the second electrode 363 form a resonance structure, thereby improving the light emission efficiency.

For example, the material of the first electrode 361 can comprise at least one of transparent conductive oxide materials, including indium tin oxide (ITO), indium zinc oxide (IZO), zinc oxide (ZnO) or the like. Moreover, the first electrode 361 can comprise a metal with high reflectivity as the reflective layer, such as, silver (Ag).

For example, with regard to OLEDs, the light-emitting layer 362 can comprise small molecular or polymeric organic materials; for example, it can be fluorescent or phosphorescent materials, and can emit red, green, blue, or white light. Furthermore, if required, the light-emitting layer can further comprise an electron injection layer, an electron transfer layer, a hole injection layer, a hole transfer layer or other functional layer(s). With regard to QLEDs, the light-emitting layer can comprise quantum dot materials, e.g., silicon quantum dot, germanium quantum dot, cadmium sulfide quantum dot, cadmium selenide quantum dot, cadmium telluride quantum dot, zinc selenide quantum dot, lead sulfide quantum dot, lead selenide quantum dot, indium phosphide quantum dot and indium arsenide quantum dot or the like. The particle size of the quantum dot is 2-20 nm.

For example, the second electrode 363 can comprise various conductive materials. For example, the second electrode 363 can comprise lithium (Li), aluminum (Al), magnesium (Mg), silver (Ag) or other metal materials.

For example, the material of the pixel definition layer 316 can comprise polyimides, polyphthalimides, polyamides, acrylic resins, benzocyclobutenes or phenolic resins or other organic insulating materials, or the material of the pixel definition layer 316 comprises silicon oxide, silicon nitride or other inorganic insulating materials, and the embodiments of the present disclosure are not limited thereto.

For example, as shown in FIG. 11, the display substrate 1 further comprises a storage capacitor 37 which can comprise a first capacitance electrode 371 and a second capacitance electrode 372. The first capacitance electrode 371 is disposed between the first gate insulating layer 312 and the second gate insulating layer 313, and the second capacitance electrode 372 is disposed between the second gate insulating layer 313 and the interlayer insulating layer 314. The first capacitance electrode 371 and the second capacitance electrode 372 are stacked, and at least partly overlap with each other in a direction perpendicular to the base substrate 200. Between the first capacitance electrode 371 and the second capacitance electrode 372, the second gate insulating layer 313 is used as dielectric material, such that the storage capacitor can be formed. The first capacitance electrode 371 and the gate electrode 323 in the pixel drive circuit 321 are arranged in the same layer. Thus, the first capacitance electrode 371 and the gate electrode 323 can be formed in the same layer in the fabrication process, e.g., they can be formed with the same material layer by a patterning process, thereby simplifying the fabrication process and reducing the production cost of the products.

In another example, as a variant of the embodiment as shown in FIG. 11, the first capacitance electrode 371 of the storage capacitor is still arranged in the same layer as the gate electrode 323, while the second capacitance electrode 372 of the storage capacitor is arranged in the same layer as the source electrode 324 and the drain electrode 325 in the pixel drive circuit 221 (i.e., they are also located within the first display-zone metal layer 331), so that between the first capacitance electrode 371 and the second capacitance electrode 372, a laminated of the second gate insulating layer 313 and the interlayer insulating layer 314 is used as dielectric material, such that the storage capacitor can be formed.

In still another example, as a variant of the embodiment as shown in FIG. 11, the first capacitance electrode 371 of the storage capacitor 37 is not arranged in the same layer as the gate electrode 323, but located between the second gate insulating layer 313 and the interlayer insulating layer 314. While the second capacitance electrode 372 of the storage capacitor 37 is arranged in the same layer as the source electrode 324 and the drain electrode 325 in the pixel drive circuit 321 are (i.e., they are also located in the first display-zone metal layer 331), so that between the first capacitance electrode 371 and the second capacitance electrode 372, the interlayer insulating layer 314 is used as dielectric material, such that the storage capacitor can be formed.

For example, as shown in FIG. 11, the display substrate 2 further comprises a first display-zone insulating layer 318 located in the display zone. The first display-zone insulating layer 318 is disposed on a side of the light-emitting element 36 away from the base substrate 200 to cover the light-emitting element 36, and provide a planarization surface on a side of the light-emitting element 36 away from the base substrate 200.

For example, as shown in FIGS. 9A and 9C, the display substrate 2 further comprises a second peripheral-zone insulating layer 2075 located within the test bonding zone 207. The second peripheral-zone insulating layer 2075 is disposed on a side of the first peripheral-zone insulating layer 2074 and the plurality of the test contact pads 2071 away from the base substrate 200 to cover the first peripheral-zone insulating layer 2074 and the plurality of the test contact pads 2071. The second peripheral-zone insulating layer 2075 has a plurality of first test-contact-pad via-holes 2075A to expose the plurality of the test contact pads 2071, respectively, so as to contact the test contact pad 2071 with the detection probe during the lighting test stage. The second peripheral-zone insulating layer 2075 and the first display-zone insulating layer 318 are arranged in the same layer, and can be formed by the same patterning process.

For example, the materials of the second peripheral-zone insulating layer 2075 and the first display-zone insulating layer 318 can comprise polyimides, polyphthalimides, polyamides, acrylic resins, benzocyclobutenes or phenolic resins or other organic insulating materials, or the materials of the second peripheral-zone insulating layer 2075 and the first display-zone insulating layer 318 comprise silicon oxide, silicon nitride or other inorganic insulating materials, and the embodiments of the present disclosure are not limited thereto.

For example, as shown in FIG. 9A, FIG. 9C and FIG. 11, the display substrate 2 further comprises an auxiliary electrode layer. The auxiliary electrode layer is located in the display zone 201 and the test bonding zone 207. The auxiliary electrode layer comprises a plurality of auxiliary electrodes 319 located within the display zone 201, and the plurality of auxiliary electrodes 319 are on a side of the first display-zone insulating layer 318 away from the base substrate 200. The auxiliary electrodes 319 can be used for other auxiliary functions, e.g., touch function. The auxiliary electrode layer further comprises a plurality of first relay electrode patterns 2076 located within the test bonding zone 207, and the plurality of first relay electrode patterns 2076 are on a side of the second peripheral-zone insulating layer 2075 away from the base substrate 200. The plurality of first relay electrode patterns 2076 are electrically connected with the plurality of the test contact pads 2071 through the plurality of first test-contact-pad via-holes 2075A. The plurality of auxiliary electrodes 319 in the display zone 201 and the first relay electrode patterns 2076 in the test bonding zone 207 are arranged in the same layer, and can be formed by the same patterning process.

For example, the auxiliary electrodes 319 for achieving a touch function can be used for achieving a capacitive type of touch structure which can be self-capacitance-type or mutual-capacitance-type. The self-capacitance-type touch structure comprises a plurality of self-capacitance electrodes arranged in an array (located in the same layer), and each of the self-capacitance electrodes is electrically connected with a touch processing circuit (e.g. a touch chip) via a touch lead. By detecting a change in the capacitance of the self-capacitance electrode caused by, e.g., the proximity of finger(s) when touching, the position detection is achieved. The mutual-capacitance-type touch structure comprises a plurality of first touch signal lines extending along a first direction and a plurality of second touch signal lines extending along a second direction, wherein the first touch signal lines and the second touch signal lines are both electrically connected with the touch processing circuit (e.g. a touch chip) through touch leads. The first direction and the second direction cross each other so as to form a touch capacitance at the cross site of the first touch signal line and the second touch signal line. By detecting a change in touch capacitance caused by, e.g., the proximity of finger(s) when touching, the position detection is achieved. The embodiments of the present disclosure are illustrated by taking a mutual-capacitance-type touch structure as example.

As shown in FIG. 11, the mutual-capacitance-type touch structure comprises a first touch signal line 3191 and a second touch signal line 3192 configured to cross each other to achieve the touch function of the display substrate. In the touch structure, the first touch signal line 3191 and the second touch signal line 3192 can be disposed in the same layer, e.g., the first touch signal lines 3191 comprises a plurality of subsections, while the second touch signal lines 3192 is continuous. At the site where the first touch signal line 3191 and the second touch signal line 3192 cross each other, a bridging electrode (not shown) is provided, which is located in a layer different from that of the first touch signal line 3191 and the second touch signal line 3192 to allow the two adjacent subsections of the first touch signal line 3191 to be electrically connected with each other. By arranging the first touch signal line 3191 and the second touch signal line 3192, it is feasible to increase the touch sensitivity of the display substrate. The first relay electrode patterns 2076 can be formed with the same material as one of the first touch signal lines 3191 and the second touch signal lines 3192 by using the same patterning process.

For example, the material for forming the auxiliary electrodes 319 can comprise indium tin oxide (ITO), and as a result gives a transparent electrode. Alternatively, the material for forming the auxiliary electrodes 319 can comprise a metal mesh, and as a result gives a transparent electrode.

Figure 9B:
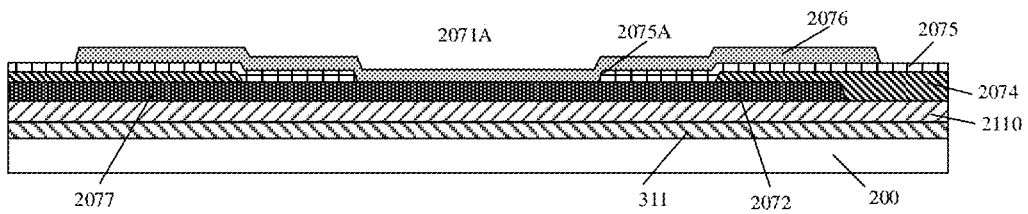
FIG. 9B is a schematic cross-sectional view taken along a section line B2-B2 in FIG. 8.
Figure 9C:
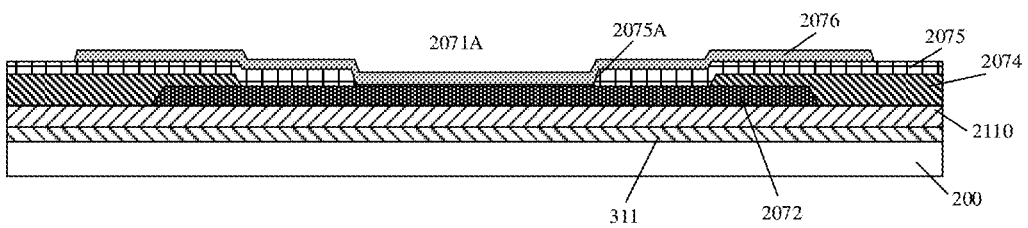
FIG. 9C is a schematic cross-sectional view taken along a section line C2-C2 in FIG. 8.

For example, as shown in FIG. 8 and FIG. 9B, the display substrate 2 further comprises a marker metal layer 2077. The section line B2-B2 in FIG. 8 passes through the test contact pad 2071A and the marker metal layer 2077 in the X direction. FIG. 9B shows a cross-sectional schematic view taken along the section line B2-B2 in FIG. 8. The marker metal layer 2077 are located at the edges adjacent to both sides of the test bonding zone 207, and is electrically connected with the first test-contact-pad metal layer 2072 of the test contact pad 2071 at the edges of the test bonding zone 207. The marker metal layer 2077 is located on a side of the first peripheral-zone insulating layer 2074 adjacent to the base substrate 200, and are arranged in the same layer as the first test-contact-pad metal layer 2072. The marker metal layer 2077 is used to align the test contact pad 2071 and the detection probe of the FPC during the bond test stage, followed by bonding the detection probe and the test contact pad 2071 together.

For example, in FIG. 8, Z21 is a distance extends upwards (along the arrow direction of Y in FIG. 8) from the boundary of the first peripheral-zone insulating layer 2074 exposing the test contact pad 2071 to the boundary of the test bonding zone 207 parallel to an arrangement direction of the test contact pad 2071. Z22 is a distance extends downwards (along a direction opposed to the arrow direction of Y in FIG. 8) from the boundary of the first peripheral-zone insulating layer 2074 exposing the test contact pad 2071 to the boundary of the test bonding zone 207 parallel to an arrangement direction of the test contact pad 2071. Z23 is a distance of the first peripheral-zone insulating layer 2074 extends from a side of the marker metal layer 2077 adjacent to the boundary of the test bonding zone 207 to the boundary of the test bonding zone 207. For example, the distance Z21 can be in a range of greater than or equal to 100 µm; the distance Z22 can be in a range of greater than or equal to 200 µm; and the Z23 can be can be greater than or equal to 100 µm. In this way, it is feasible to efficiently decrease the film height difference between the detection probe and the detection probe, reducing the risk of the lighting test, and improve the detection efficiency and yield of the display substrate.

For example, as shown in FIG. 9A, a vertical distance between the surface of the first peripheral-zone insulating layer 2074 away from the base substrate 200 and the base substrate 200 is H21, and a vertical distance between the surface of the test contact pad 2071 away from the base substrate 200 and the base substrate 200 is H22. For example, H21 is slightly greater than H22. For example, in FIG. 9A, the step difference H23 is a distance between the surface of the first relay electrode patterns 2076 above the test contact pad 2071 away from the base substrate 200 and the surface of the first relay electrode patterns 2076 on the periphery of the test contact pad 2071 away from the base substrate 200 in a direction perpendicular and the base substrate 200. The reduction of the step difference H23 can increase the bonding capacity of the test detection and the test contact pad, which is beneficial for the detection efficiency and yield of the products.

Figure 10A:
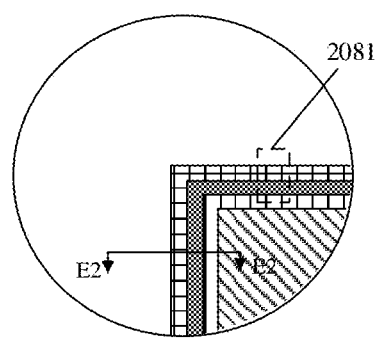
FIG. 10A is an enlarged schematic view of a zone D2 in FIG. 8.
Figure 10B:
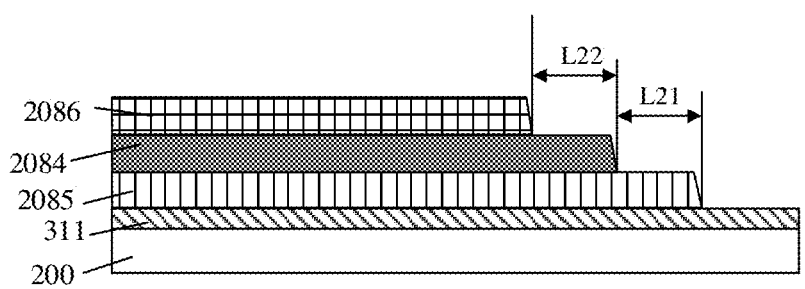
FIG. 10B is a schematic cross-sectional view taken along a section line E2-E2 in FIG. 10A.

For example, in some embodiments, FIG. 10A is an enlarged schematic view of the region D2 in FIG. 8; and FIG. 10B is a schematic cross-sectional view taken along a section line E2-E2 in FIG. 10A. As shown in FIG. 8, FIG. 10A and FIG. 10B, the peripheral zone 202 further comprises a bonding peripheral zone 206 surrounding the test bonding zone 207.

For example, as shown in FIG. 10A and FIG. 10B, the display substrate further comprises a peripheral-zone insulating laminate 2081. The peripheral-zone insulating laminate 2081 is disposed on the base substrate 200 and located within the bonding peripheral zone 206, and surrounds the test bonding zone 207. For example, the bonding peripheral zone 206 further comprises a buffer layer 311 located between the peripheral-zone insulating laminate 2081 and the base substrate 200. The buffer layer 311 in the bonding peripheral zone 206, the buffer layer 311 in the display zone 201, and the buffer layer 311 in the test bonding zone 207 are the same film layer formed in the same fabrication process.

For example, in some embodiments, the peripheral-zone insulating laminate comprises a plurality of insulating layers, for example, comprises at least two insulating layers. One of the at least two insulating layers away from the base substrate exposes the other of the at least two insulating layers adjacent to the base substrate on a side of the one of the at least two insulating layers adjacent to the base substrate so as to form at least two stepped structure on the periphery of the test bonding zone. As shown in FIG. 10A and FIG. 10B, the peripheral-zone insulating laminate 2081 comprises a first sublayer 2085, a second sublayer 2084 and a third sublayer 2086 which are sequentially laminated on the base substrate 200. The third sublayer 2086 is located on a side of the first sublayer 2085 away from the base substrate 200, and the second sublayer 2084 is located between the first sublayer 2085 and the third sublayer 2086. The second sublayer 2084 exposes the first sublayer 2085 on a side of the second sublayer 2084 adjacent to the base substrate 200, the third sublayer 2086 exposes the second sublayer 2084 on a side of the third sublayer 2086 adjacent to the base substrate 200 to allow the peripheral-zone insulating laminate 2081 to form a multiple-stepped structure, so that the detection probe of the FPC is not prone to arch itself at the boundary EG of the test bonding zone, thereby improving the bonding capacity of the detection probe and the test contact pad.

For example, in some embodiments, the first sublayer 2085 and the passivation layer 315 of the pixel structure 31 in FIG. 11 are arranged in the same layer. Thus, the first sublayer 2085 and the passivation layer 315 can be formed in the same layer in the fabrication process, e.g., they can be formed with the same material layer by a patterning process, thereby simplifying the fabrication process. The second sublayer 2084 and the pixel definition layer 316 of the pixel structure 31 in FIG. 11 are arranged in the same layer. Thus, the second sublayer 2084 and the pixel definition layer 316 can be formed in the same layer in the fabrication process, e.g., they can be formed with the same material layer by a patterning process, thereby simplifying the fabrication process. For example, the third sublayer 2086 and the passivation layer 318 of the pixel structure 31 in FIG. 11 are arranged in the same layer. Thus, the third sublayer 2086 and the display zone insulating layer 318 can be formed in the same layer in the fabrication process, e.g., they can be formed with the same material layer by a patterning process, thereby simplifying the fabrication process.

For example, as shown in FIG. 10A and FIG. 10B, the length of the first sublayer 2085 exposed by the second sublayer 2084 on the periphery of the test bonding zone 207 is L21. For example, L21 can be in a range of 8 μm to 12 μm, e.g., L21 can be about 10 μm. Here, the term "about" means that L21 can vary in the range, for example "±15%" of its value. The length of the second sublayer 2084 exposed by the third sublayer 2086 on the periphery of the test bonding zone 207 is L22. For example, L22 can be in a range of 8 μm to 12 μm, e.g., L22 can be about 10 μm. Here, the term "about" means that L22 can vary in the range, for example "±15%" of its value. In other embodiments, the values of L12 and L13 can be selected depending on the length of the detection probe and the length of the test contact pad.

Figure 12:
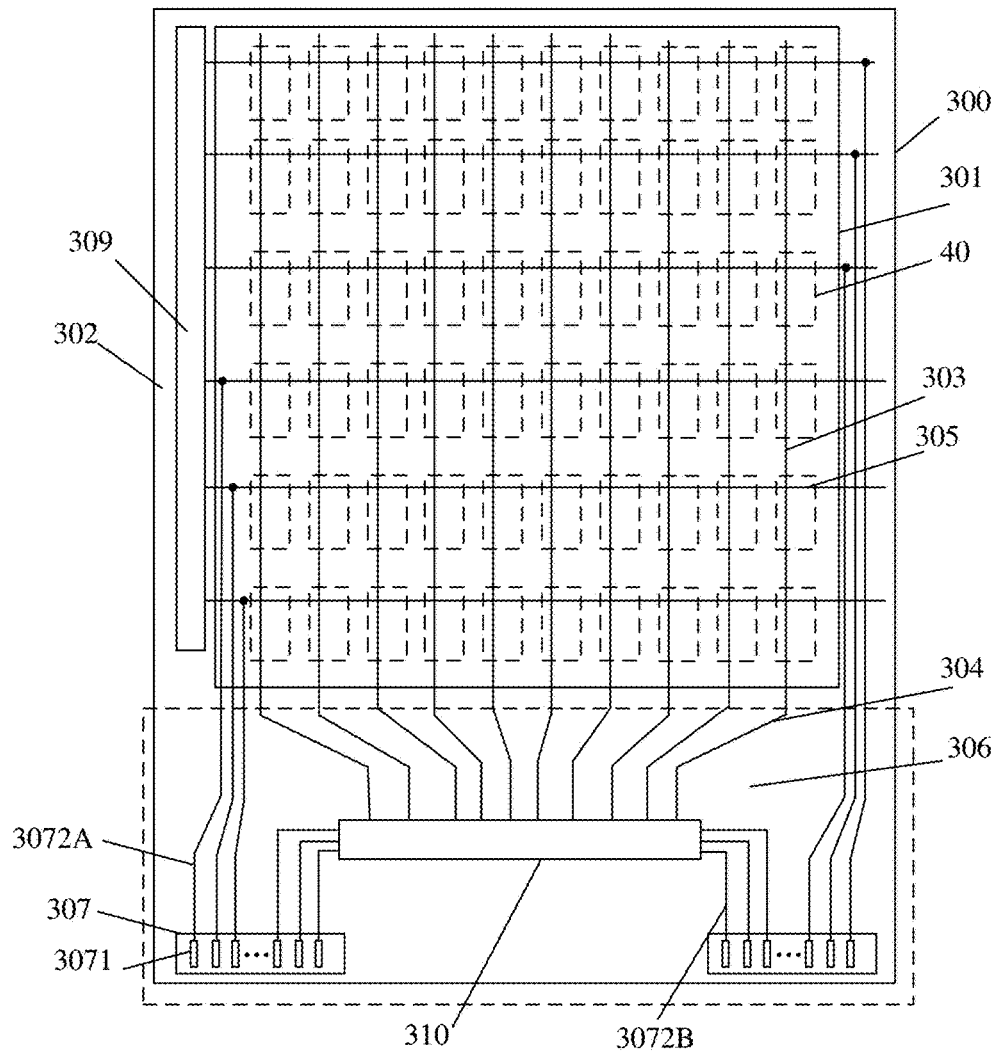
FIG. 12 is a planar view of a display substrate provided in yet another embodiment of the present disclosure.
Figure 13:
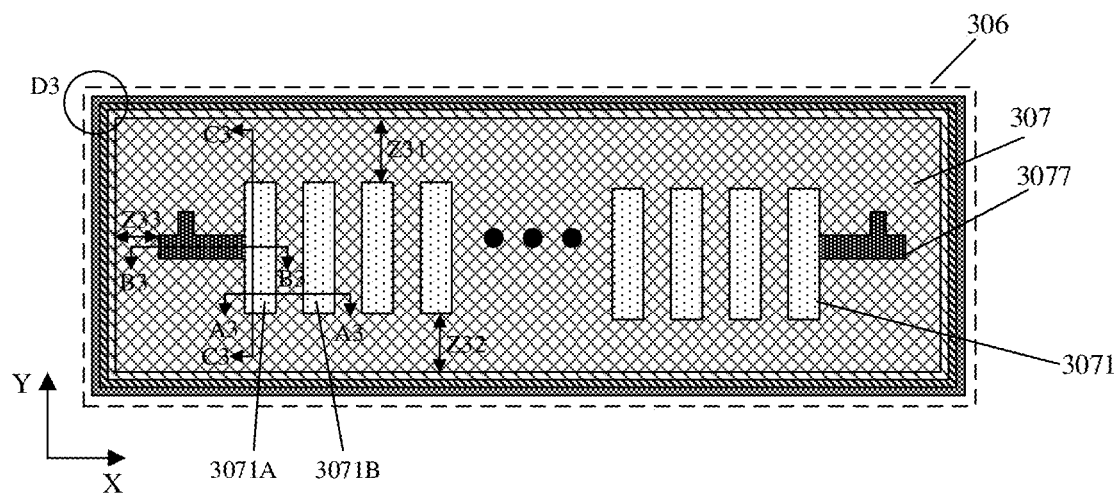
FIG. 13 is a planar view of a bonding peripheral zone and a test bonding zone of a display substrate provided in yet another embodiment of the present disclosure.

At least an embodiment of the present disclosure further provides yet another display substrate. FIG. 12 is a planar view of yet another display substrate provided in an embodiment of the present disclosure, and FIG. 13 is a planar view of a bonding peripheral zone and a test bonding zone of yet another display substrate provided in embodiment of the present disclosure. For example, the display substrate is used in organic light-emitting dioxide (OLED) display devices or quantum dot light-emitting diode (QLED) display devices.

For example, as shown in FIG. 12, a display substrate 3 comprises a base substrate 300 comprising a display zone 301 and a peripheral zone 302 surrounding the display zone 301. The peripheral zone 302 comprises a test bonding zone 307 located on a side of the display zone 301 (as shown in FIG. 12, located below the display zone 301). FIG. 12 shows two test bonding zones 307, but the embodiments of the present disclosure are not limited thereto. The test bonding zone 307 comprises a plurality of test contact pads 3071. The test bonding zone 307 is used for bonding to the flexible printed circuit (FPC) of the test equipment during the lighting test stage, allowing the test contact pad 3071 to be electrically connected with the detection probe, thereby performing the lighting test.

For example, the base substrate 300 can be glass, quartz, metal, resin-based plates or the like. For example, the material of the base substrate can comprise organic materials. For example, the organic materials can be polyimides, polycarbonates, polyacrylates, polyetherimines, polyethersulfones, polyethylene terephthalates, polyethylene naphthalates, or other resinous materials. The base substrate 300 can be a flexible or inflexible substrate, and the embodiments of the present disclosure are not limited thereto.

For example, the display substrate 3 further comprises a plurality of sub-pixel units 40 arranged in an array and located within the display zone 301, a plurality of data lines 303, and a plurality of scan lines 305. The data lines 303 and the scan lines 305 are electrically connected with the sub-pixel units 40 to provide a data signal and a gate scanning signal so as to the sub-pixel units 40. The display substrate 3 further comprises a gate electrode drive circuit 309 located within the peripheral zone 302. The gate electrode drive circuit 309 is connected with the scan lines 305 to provide a gate scan signal to the sub-pixel units 40 through the scan lines 305.

For example, the display substrate 3 further comprises connection lines 304 located within the peripheral zone 302 and a test unit 310. The connection lines 304 are connected to the data lines 303 and extend to the region where the test unit 310 is located. The test unit 310 is located between the display zone 301 and the test bonding zone 307, and the ends of the connection lines 304 away from the display zone 301 are gathered into the test unit 310. The peripheral zone 302 comprises a first lead 3072A and a second lead 3072B. For example, the test unit 310 can comprise a data selection unit, a test circuit, and the like. One of the plurality of the test contact pads 3071 is electrically connected to the scan line 305 of the display zone 301 via the first lead 3072A; and another of the plurality of the test contact pads 3071 is electrically connected to the test unit 310 via the second lead 3072B, so as to test the display characteristics of the display zone during the lighting test stage.

For example, in some embodiments of the present disclosure, the display substrate 3 can further comprise a detection line for providing the sub-pixel units 30 with a detection signal, a power line for providing the sub-pixel units 30 with a voltage signal, and the like.

For example, as shown in FIG. 13, the plurality of the test contact pads 3071 are arranged in a row, and a row direction of the plurality of the test contact pads 3071 is parallel to the extension direction of a side edge of the display zone 301 facing towards the test bonding zone 307, that is, the X direction as shown in the figures, so as to minimize the space which the test contact pads 3071 occupy. For example, the arrangement of the plurality of the test contact pads 3071 can vary depending on the size of space of the display substrate 3 and the requirements of the test equipment, and the embodiments of the present disclosure are not limited thereto.

Figure 14A:
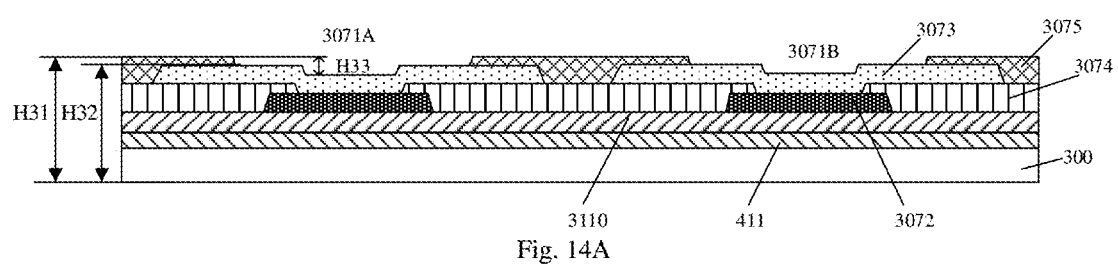
FIG. 14A is a schematic cross-sectional view taken along a section line A3-A3 in FIG. 13.

For example, the section line A3-A3 in FIG. 13 passes through the test contact pad 3071A and the test contact pad 3071B in the X direction, and the section line C3-C3 FIG. 13 passes through the test contact pad 3071A in the Y direction (parallel to the test contact pad 3071A). FIG. 14A is a schematic cross-sectional view taken along the section line A3-A3 in FIG. 13; and FIG. 14C is a schematic cross-sectional view taken along the section line C3-C3 in FIG. 13. As shown in FIG. 14A and FIG. 14C, the test contact pad 3071A (3071B) comprises a first test-contact-pad metal layer 3072 located on the base substrate 300, and a second test-contact-pad metal layer 3073 located on a side of the first test-contact-pad metal layer 3072 away from the base substrate 300. The display substrate 3 further comprises a first peripheral-zone insulating layer 3074 located in the test bonding zone 307, a via-hole is formed in the first peripheral-zone insulating layer 3074 in order to expose the first test-contact-pad metal layer 3072. The first peripheral-zone insulating layer 3074 is configured to cover the periphery of the first test-contact-pad metal layer 3072 so as to avoid the damage of the first test-contact-pad metal layer 3072 caused by the fabrication process of other film layers. The second test-contact-pad metal layer 3073 is connected with the first test-contact-pad metal layer 3072 through the via-hole in the first peripheral-zone insulating layer 3074. The design of film layer structure in this embodiment can reduce the step difference of the film which the test contact pad is located, so that the detection probe can better contact the test contact pad during the lighting test stage, thereby improving the detection efficiency and yield of the products.

For example, the material of the first test-contact-pad metal layer 3072 and the second test-contact-pad metal layer 3073 can comprise metal materials or alloy materials, such as, a mono-layer or multi-layer metal structure formed by molybdenum, aluminum, titanium, or the like.

For example, as shown in FIG. 13, FIG. 14A and FIG. 14C, the display substrate 3 further comprises a second peripheral-zone insulating layer 3075 located within the test bonding zone 307 and configured to expose a surface of the test contact pad 3071 facing away from the base substrate 300 and cover the periphery of the second test-contact-pad metal layer 3072, thereby avoiding a damage of the second test-contact-pad metal layer 3073 caused by the fabrication process of other film layers.

For example, as shown in FIG. 14A and FIG. 14C, the display substrate 3 further comprises a bonding-zone interlayer insulating layer 3110 located within the test bonding zone 307. The bonding-zone interlayer insulating layer 3110 is located on a side of the first test-contact-pad metal layer 3072 and the first peripheral-zone insulating layer 3074 adjacent to the base substrate 300.

For example, as shown in FIG. 14A and FIG. 14C, the display substrate 3 further comprises a buffer layer 411 located within the test bonding zone 307 and disposed between the bonding-zone interlayer insulating layer 3110 and the base substrate 300. The buffer layer 411 serving as a transition layer can both prevent the invasion of hazardous materials in the base substrate into the interior of display substrate and increase the adhesion of the film layers in the display substrate to the base substrate 300.

Figure 16:
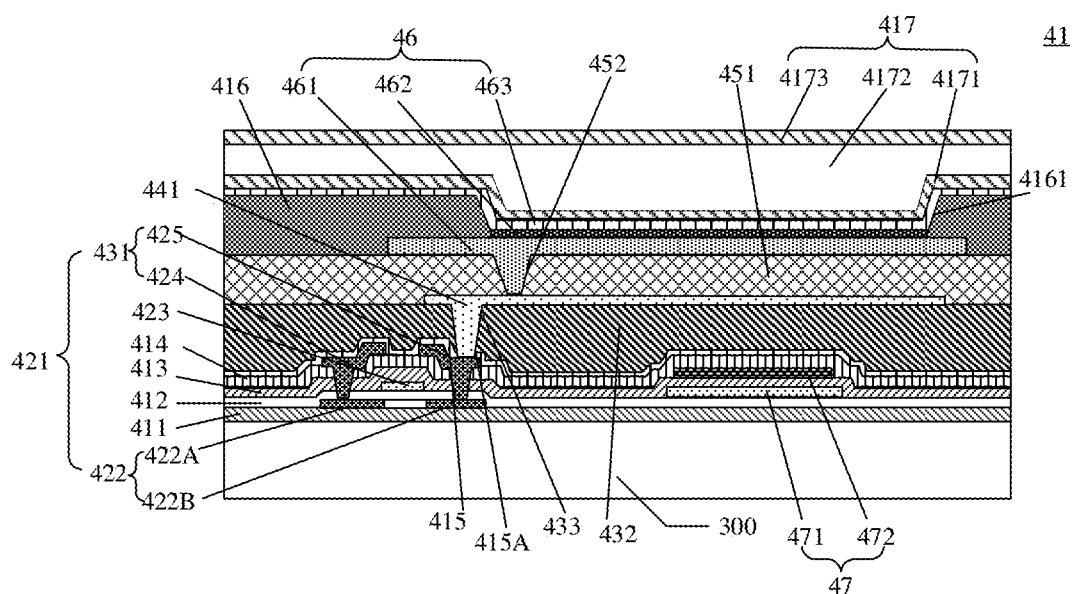
FIG. 16 is a schematic cross-sectional view of a display zone of a display substrate provided in yet another embodiment of the present disclosure.

FIG. 16 is a schematic cross-sectional view of a display zone of a display substrate provided in an embodiment of the present disclosure. As shown in FIG. 16, each of the plurality of the sub-pixel units in the display zone 301 comprises a pixel structure 41. The pixel structure 41 can comprise a pixel drive circuit 421, a first planarization layer 432, a first relay electrode 441, a second planarization layer 451 and a light-emitting element 46 and a packaging layer 417.

For example, as shown in FIG. 16, the pixel structure 41 further comprises a buffer layer 411 located on the base substrate 300 in the display zone 301; and the pixel drive circuit 421 comprises an active layer 422 located on the buffer layer 411, a first gate insulating layer 412 located on a side of the active layer 411 away from the base substrate 300, a gate electrode 423 located on the first gate insulating layer 412, a second gate insulating layer of display zone 413 located on a side of the gate electrode 423 away from the base substrate 300, an interlayer insulating layer 414 located on the second interlayer insulating layer 413, and two source-drain electrodes located on the interlayer insulating layer 414 (including a source electrode 424 and a drain electrode 425). The buffer 411 in the display zone 301 and the buffer layer 411 in the test bonding zone 307 are the same film layer formed in the same fabrication process. The buffer layer 411 serving as a transition layer can both prevent the invasion of hazardous materials in the base substrate 300 into the interior of display substrate and increase the adhesion of the film layers in the display substrate to the base substrate 300. The bonding-zone interlayer insulating layer 3110 in the bonding zone 307 and the interlayer insulating layer 414 are arranged in the same layer. Thus, the bonding-zone interlayer insulating layer 3110 and the interlayer insulating layer 414 can be formed in the same layer in the fabrication process, e.g., they can be formed with the same material layer by a patterning process, thereby simplifying the fabrication process.

For example, the material of the buffer layer 411 can comprise silicon oxide, silicon nitride, silicon oxynitride, or other insulating materials. The material of one or more of the interlayer insulating layer 414, the second gate insulating layer 413 and the first gate insulating layer 412 can comprise silicon oxide, silicon nitride, silicon oxynitride, or other insulating materials. The materials of the interlayer insulating layer 414, the second gate insulating layer 413 and the first gate insulating layer 412 can be the same or different from one another.

For example, as shown in FIG. 16, the active layer 422 can comprise a source electrode zone 422A, a drain electrode zone 422B and a channel region located between the source electrode zone 422A and the drain electrode zone 422B. The interlayer insulating layer 414, the second gate insulating layer 413 and the first gate insulating layer 412 have via-holes to expose the source electrode zone 422A and the drain electrode zone 422B. The source electrode 424 and the drain electrode 425 are electrically connected with the source electrode zone 422A and the drain electrode zone 422B through the via-holes in the interlayer insulating layer 414, the second gate insulating layer 413 and the first gate insulating layer 412, respectively. The gate electrode 423 overlaps with the channel region in the active layer 422 located between the source electrode zone 422A and the drain electrode zone 422B in a direction perpendicular to the base substrate 300.

For example, the first planarization layer 432 is located on a side of the source electrode 424 and the drain electrode 425 away from the base substrate 300, and used to provide a first planarization surface to planarize a surface of the pixel drive circuit away from the base substrate. The first planarization layer 432 can planarize an uneven surface caused by the pixel drive circuit 421, and thus prevent the defects in the light-emitting element due to the irregularity caused by the pixel drive circuit. A first via-hole 433 is formed in the first planarization layer 432 to expose the source electrode 424 or the drain electrode 425 (as shown in the figures). A first relay electrode 441 is formed on a side of the first planarization layer 432 away from the base substrate 300. The first relay electrode 441 is electrically connected with the drain electrode 425 (or with the source electrode 424) through the first via-hole 433. The first relay electrode 441 can avoid of forming a vertical through-hole with a relative large aperture in the first planarization layer 432, thereby improving the quality of the electrical connection through via-hole. At the same time, it is also feasible to form the first relay electrode 441 and other signal lines (e.g., power lines, etc.) in the same layer, thereby avoiding increased process steps. The first relay electrode 441 and the second test-contact-pad metal layer 3073 of the test contact pad 3071 are arranged in the same layer, and thus the first relay electrode 441 and the second test-contact-pad metal layer 3073 can be formed in the same layer in the fabrication process, e.g., they can be formed with the same layer of material by a patterning process, thereby simplifying the fabrication process.

For example, the material of the first planarization layer 432 comprise silicon oxide, silicon nitride, silicon oxynitride, or other inorganic insulating materials, and can also comprise polyimides, polyphthalimides, polyamides, acrylic resins, benzocyclobutenes or phenolic resins or other organic insulating materials, and the embodiments of the present disclosure are not limited thereto.

For example, the material of the first relay electrode 441 can comprise metal materials or alloy materials, such as, a mono-layer or multi-layer metal structure formed by molybdenum, aluminum, titanium or the like.

For example, the material of the active layer 422 can comprise polycrystalline silicon, or oxide semiconductors (e.g., Indium Gallium Zinc Oxide). The material of the gate electrode 423 can comprise metal materials or alloy materials, such as, a mono-layer or multi-layer metal structure formed by molybdenum, aluminum, titanium, and the like. For example, the multilayer structure is a multilayer metal laminate (such as, a titanium-aluminum-titanium three-layer metal laminate). The material of the source electrode 424 and the drain electrode 425 can comprise metal materials or alloy materials, such as, a mono-layer or multi-layer metal structure formed by molybdenum, aluminum, titanium, and the like. For example, the multilayer structure is a multilayer metal laminate such as, a titanium-aluminum-titanium three-layer metal laminate). Embodiments of the present disclosure do not limit particularly the material of various functional layers.

For example, as shown in FIG. 16, the pixel drive circuit 421 can further comprise a first display-zone metal layer 431. The first display-zone metal layer 431 and the first test-contact-pad metal layer 3072 are arranged in the same layer. The first display-zone metal layer 431 comprises a source electrode 424 and the drain electrode 425 of the pixel drive circuit 421. The source electrode 424 and the drain electrode 425 and the first test-contact-pad metal layer 3072 are arranged in the same layer. Thus, the source electrode 424 and the drain electrode 425 and the first test-contact-pad metal layer 3072 can be formed in the same layer in the fabrication process, e.g., they can be formed with the same material layer by a patterning process, thereby simplifying the fabrication process and reducing the production cost of the products.

For example, as shown in FIG. 12, the first lead 3072A and the second lead 3072B are formed by the first test-contact-pad metal layer 3072 of the respective test contact pad 3071 extending in a direction towards the display zone 301. The first lead 3072A, the second lead 3072B and the first test-contact-pad metal layer 3072 are formed with the same material by a patterning process.

For example, as shown in FIG. 16, the display substrate 3 further comprises a passivation layer 415 located between the pixel drive circuit 421 and the first planarization layer 432 and comprising a passivation-layer via-hole 415A. The passivation layer 415 can protect the source electrode 424 and the drain electrode 425 of the pixel drive circuit 421 from moisture corrosion. The pixel drive circuit and the first relay electrode 441 are also electrically connected with each other through the passivation-layer via-hole 415A. The first peripheral-zone insulating layer 3074 in the bonding zone 307 and the passivation layer 415 are arranged in the same layer. Thus, the first peripheral-zone insulating layer 3074 and the passivation layer 415 can be formed in the same layer in the fabrication process, e.g., they can be formed with the same material layer by a patterning process, thereby simplifying the fabrication process.

For example, the material of the passivation layer 415 can comprise organic insulating materials or inorganic insulating materials, such as, silicon nitride materials, which can protect the pixel drive circuit from moisture corrosion well due to its high dielectric constant and good hydrophobic function.

For example, as shown in FIG. 16, the second planarization layer 451 is disposed on a side of the first relay electrode 441 away from the base substrate 300, and used to provide a planarization surface on a side of the first relay electrode 441 away from the base substrate 300. Furthermore, a second via-hole 452 is formed in the second planarization layer 451. The second planarization layer 451 and the second peripheral-zone insulating layer 3075 in the test bonding zone 307 are formed in the same layer, and thus the second planarization layer 451 and the second peripheral-zone insulating layer 3075 can be formed in the same layer in the fabrication process, e.g., they can be formed with the same material layer by a patterning process, thereby simplifying the fabrication process.

For example, the material of the second planarization layer 451 comprise silicon oxide, silicon nitride, silicon oxynitride, or other inorganic insulating materials; the material of the second planarization layer 451 can also comprise polyimides, polyphthalimides, polyamides, acrylic resins, benzocyclobutenes or phenolic resins or other organic insulating materials, and the embodiments of the present disclosure are not limited thereto.

For example, still as shown in FIG. 16, the light-emitting element 46 is disposed on the second planarization layer 451, that is, the light-emitting element 46 is disposed on a side of the second planarization layer 451 away from the base substrate 300. The light-emitting element 46 comprises a first electrode 461, a light-emitting layer 462 and a second electrode 463. The first electrode 461 of the light-emitting element 46 is electrically connected with the first relay electrode 441 through the second via-hole 4161 in the second planarization layer 451. A pixel definition layer 416 is formed on a side of the first electrode 461 away from the base substrate 300. The pixel definition layer 416 comprises a plurality of openings 4161 for defining a plurality of pixel units. Each of the plurality of the openings 4161 exposes the first electrode 461, and the light-emitting layer 462 is disposed in the plurality of openings 4161 of the pixel definition layer 416. The second electrode 463 can be, e.g., disposed in a portion or all of the display zone, so that it can be formed on the whole surface in the fabrication process.

For example, the first electrode 461 can comprise a reflective layer, and the second electrode 463 can comprise a transparent layer or a semi-transparent layer. As a result, the first electrode 461 can reflect a light emitted by the light-emitting layer 462, which is emitted through the second electrode 463 to the external environment, thereby improving the light emitting efficiency. When the second electrode 463 comprises a semi-transparent layer, some light reflected by the first electrode 461 is reflected again by the second electrode 463, and thus the first electrode 461 and the second electrode 463 form a resonance structure, thereby improving the light emission efficiency.

For example, the material of the first electrode 461 can comprise at least one of transparent conductive oxide materials, including indium tin oxide (ITO), indium zinc oxide (IZO), zinc oxide (ZnO) or the like. Moreover, the first electrode 461 can comprise a metal with high reflectivity as the reflective layer, such as, silver (Ag).

For example, with regard to OLEDs, the light-emitting layer 462 can comprise small molecular or polymeric organic materials; for example, it can be fluorescent or phosphorescent materials, and can emit red, green, blue, or white light. Furthermore, if required, the light-emitting layer can further comprise an electron injection layer, an electron transfer layer, a hole injection layer, a hole transfer layer or other functional layer(s). With regard to QLEDs, the light-emitting layer can comprise quantum dot materials, e.g., silicon quantum dot, germanium quantum dot, cadmium sulfide quantum dot, cadmium selenide quantum dot, cadmium telluride quantum dot, zinc selenide quantum dot, lead sulfide quantum dot, lead selenide quantum dot, indium phosphide quantum dot and indium arsenide quantum dot or the like. The particle size of the quantum dot is 2-20 nm.

For example, the second electrode 463 can comprise various conductive materials. For example, the second electrode 463 can comprise lithium (Li), aluminum (Al), magnesium (Mg), silver (Ag) or other metal materials.

For example, the material of the pixel definition layer 416 can comprise polyimides, polyphthalimides, polyamides, acrylic resins, benzocyclobutenes or phenolic resins or other organic insulating materials, or the material of the pixel definition layer 416 comprises silicon oxide, silicon nitride or other inorganic insulating materials, and the embodiments of the present disclosure are not limited thereto.

For example, as shown in FIG. 16, the display substrate 3 further comprises a storage capacitor 47 which can comprise a first capacitance electrode 471 and a second capacitance electrode 472. The first capacitance electrode 471 is disposed between the first gate insulating layer 412 and the second gate insulating layer 413, and the second capacitance electrode 472 is disposed between the second gate insulating layer 413 and the interlayer insulating layer 414. The first capacitance electrode 471 and the second capacitance electrode 472 are stacked, and at least partly overlap with each other in a direction perpendicular to the base substrate 300. Between the first capacitance electrode 471 and the second capacitance electrode 472, the second gate insulating layer 413 is used as dielectric material, such that the storage capacitor can be formed. The first capacitance electrode 471 and the gate electrode 423 in the pixel drive circuit 421 are arranged in the same layer. Thus, the first capacitance electrode 471 and the gate electrode 423 can be formed in the same layer in the fabrication process, e.g., they can be formed with the same material layer by a patterning process, thereby simplifying the fabrication process and reducing the production cost of the products.

In another example, as a variant of the embodiment as shown in FIG. 16, the first capacitance electrode 471 of the storage capacitor is still arranged in the same layer as the gate electrode 423, while the second capacitance electrode 472 of the storage capacitor is arranged in the same layer as the source electrode 424 and the drain electrode 425 in the pixel drive circuit 421 (i.e., they are also located within the first display-zone metal layer 431), so that between the first capacitance electrode 471 and the second capacitance electrode 472, a laminate of the second gate insulating layer 413 and the interlayer insulating layer 414 is used as dielectric material, such that the storage capacitor can be formed.

In still another example, as a variant of the embodiment as shown in FIG. 16, the first capacitance electrode 471 of storage capacitor is not arranged in the same layer as the gate electrode 423, but located between the second gate insulating layer 413 and the interlayer insulating layer 414, while the second capacitance electrode 472 of the storage capacitor is arranged in the same layer as the source electrode 424 and the drain electrode 425 in the pixel drive circuit 421 (i.e., they are also located in the first display-zone metal layer 431), so that in the first capacitance electrode 471 and the second capacitance electrode 472, the interlayer insulating layer 414 is used as dielectric material, such that the storage capacitor can be formed.

For example, as shown in FIG. 16, the packaging layer 417 is disposed on a side of the light-emitting element 46 away from the base substrate 300. The packaging layer 417 seals the light-emitting element 46 thereby reducing or preventing any deterioration of the light-emitting element 46 caused by moisture and/or oxygen in the environment. The packaging layer 417 can be a single layer structure or a composite layer structure comprising structure formed by stacking inorganic layer(s) and organic layer(s). The packaging layer 417 comprises at least one packaging sublayer. For example, the packaging layer 417 can comprise a first inorganic packaging sublayer 4171, a first organic packaging sublayer 4172, and a second inorganic packaging sublayer 4173 arranged in this order.

For example, the material of the packaging layer 417 can comprise silicon nitride, silicon oxide, silicon oxynitride, polymeric resins, or other insulating materials. Silicon nitride, silicon oxide, silicon oxynitride or other inorganic materials has high compactness, and can prevent the invasion of moisture, oxygen, or the like. The material of the organic packaging layer can be desiccant-containing polymer materials or vapor-blocking polymer materials, such as, polymer resins or the like to planarize the surface of the display substrate to relieve the stress of the first inorganic packaging layer and the second inorganic packaging layer, and can further comprise desiccant or other water absorbent materials to adsorb water, oxygen and other substances invading the interior.

Figure 14B:
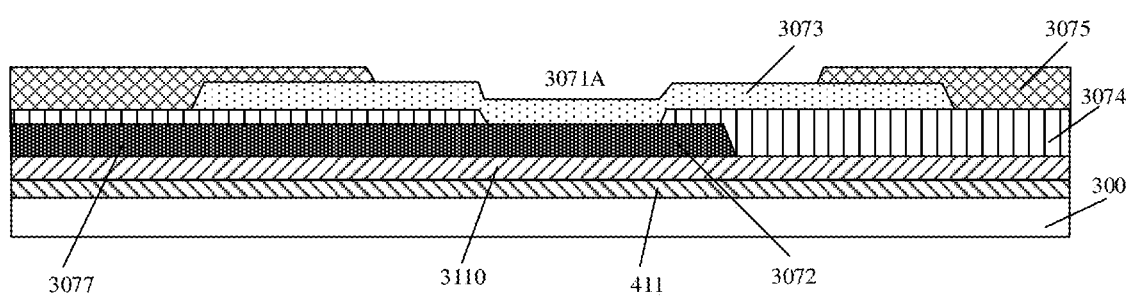
FIG. 14B is a schematic cross-sectional view taken along a section line B3-B3 in FIG. 13.
Figure 14C:
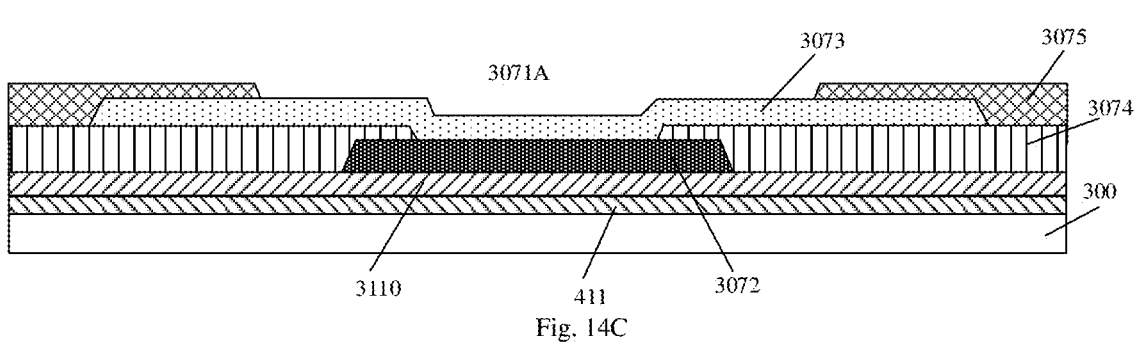
FIG. 14C is a schematic cross-sectional view taken along a section line C3-C3 in FIG. 13.

For example, as shown in FIG. 13 and FIG. 14B, the display substrate 3 further comprises a marker metal layer 3077. The section line B3-B3 in FIG. 13 passes through the test contact pad 3071A and the marker metal layer 3077 in the X direction. FIG. 14B shows a cross-sectional schematic view taken along the section line B3-B3 in FIG. 13. The marker metal layer 3077 are located at the edges adjacent to both sides of the test bonding zone 307, and is electrically connected with the first test-contact-pad metal layer 3072 of the test contact pad 3071 at the edges of the test bonding zone 307. The marker metal layer 3077 is located on a side of the first peripheral-zone insulating layer 3074 adjacent to the base substrate 300, and are arranged in the same layer as the first test-contact-pad metal layer 3072. The marker metal layer 3077 is used to align the test contact pad 3071 and the detection probe of the FPC during the bond test stage, followed by bonding the detection probe and the test contact pad 3071 together.

For example, in FIG. 13, Z31 is a distance extends upwards (along the arrow direction of Y in FIG. 13) from the boundary of the first peripheral-zone insulating layer 3074 exposing the test contact pad 3071 to the boundary of the test bonding zone 307 parallel to an arrangement direction of the test contact pad 3071. Z32 is a distance extends downwards (along a direction opposed to the arrow direction of Y in FIG. 13) from the boundary of the first peripheral-zone insulating layer 3074 exposing the test contact pad 3071 to the boundary of the test bonding zone 307 parallel to an arrangement direction of the test contact pad 3071. Z33 is a distance of the first peripheral-zone insulating layer 3074 extends from a side of the marker metal layer 3077 adjacent to the boundary of the test bonding zone 307 to the boundary of the test bonding zone 307. For example, Z31 can be in a range of greater than or equal to 100 μm; Z32 can be in a range of greater than or equal to 200 μm; and Z23 can be can be greater than or equal to 100 μm. In this way, it is feasible to efficiently decrease the film height difference between the detection probe and the detection probe, reducing the risk of the lighting test, and improve the detection efficiency and yield of the display substrate.

For example, as shown in FIG. 14A, a vertical distance between the surface of the first peripheral-zone insulating layer 3075 away from the base substrate 300 and the base substrate 300 is H31, and a vertical distance between the surface of the test contact pad 3071 away from the base substrate 300 and the base substrate 300 is H32. For example, H31 is slightly greater than H32.

For example, in FIG. 14A, the step difference H33 is a distance between the surface of the second test-contact-pad metal layer 3073 of the test contact pad 3071 away from the base substrate 300 and the surface of the second peripheral-zone insulating layer 3075 on the periphery of the test contact pad 3071 away from the base substrate 300 in a direction perpendicular to the base substrate 300. The reduction of the step difference H33 can increase the bonding capacity of the test detection and the test contact pad, which is beneficial for the detection efficiency and yield of the products.

Figure 15A:
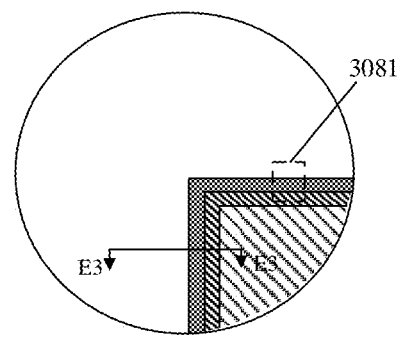
FIG. 15A is an enlarged schematic view of a zone D3 in FIG. 13.
Figure 15B:
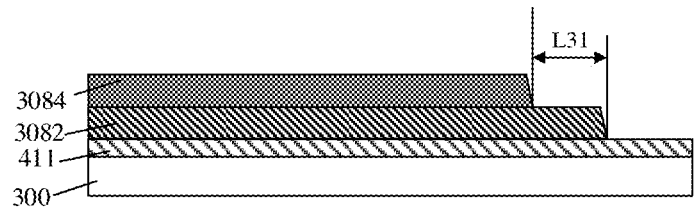
FIG. 15B is a schematic cross-sectional view taken along a section line E3-E3 in FIG. 15A.

For example, in some embodiments, FIG. 15A is an enlarged schematic view of the region D3 in FIG. 13; and FIG. 15B is a schematic cross-sectional view taken along a section line E3-E3 in FIG. 15A. As shown in FIG. 13, FIG. 15A and FIG. 15B, the peripheral zone 302 further comprises a bonding peripheral zone 306 surrounding the test bonding zone 307.

For example, as shown in FIG. 15A and FIG. 15B, the display substrate further comprises a peripheral-zone insulating laminate 3081. The peripheral-zone insulating laminate 3081 is disposed on the base substrate 300 and located within the bonding peripheral zone 306, and surrounds the test bonding zone 307. For example, the bonding peripheral zone 306 further comprises a buffer layer 411 located between the peripheral-zone insulating laminate 3081 and the base substrate 300. The buffer layer 411 in the bonding peripheral zone 306, the buffer layer 411 in the display zone 301, and the buffer layer 411 in the test bonding zone 307 are the same film layer formed in the same fabrication process.

As shown in FIG. 15A and FIG. 15B, the peripheral-zone insulating laminate 3081 comprises a first sublayer 3082 and a second sublayer 3084 which are sequentially laminated on the base substrate 300. The second sublayer 3084 is located on a side of the first sublayer 3082 away from the base substrate 300. The second sublayer 3084 exposes the first sublayer 3082 on a side of the second sublayer 3084 adjacent to the base substrate 300 to allow the peripheral-zone insulating laminate 3081 to form a stepped structure, so that the detection probe of the FPC is not prone to arch itself at the boundary EG of the test bonding zone, thereby improving the bonding capacity of the detection probe and the test contact pad.

For example, in some embodiments, the first sublayer 3082 and the first planarization layer 432 of the pixel structure 41 in FIG. 16 are arranged in the same layer. Thus, the first sublayer 3082 and the first planarization layer 432 can be formed in the same layer in the fabrication process, e.g., they can be formed with the same material layer by a patterning process, thereby simplifying the fabrication process. The second sublayer 3084 and the pixel definition layer 416 of the pixel structure 41 in FIG. 16 are arranged in the same layer. Thus, the second sublayer 3084 and the pixel definition layer 416 can be formed in the same layer in the fabrication process, e.g., they can be formed with the same material layer by a patterning process, thereby simplifying the fabrication process.

For example, as shown in FIG. 15A and FIG. 15B, the length of the first sublayer 3082 exposed by the second sublayer 3084 on the periphery of the test bonding zone 307 is L31. For example, L31 can be in a range of 8 μm to 12 μm, e.g., L31 can be about 10 μm. Here, the term "about" means that L31 can vary in the range, for example "±15%" of its value. In other embodiments, L31 can be selected depending on the length of the detection probe and the length of the test contact pad.

At least an embodiment of the present disclosure provides a display device which can comprise the display substrate of any one of the above embodiments.

For example, in some examples, the display device can further comprise a flexible circuit board and a control chip. For example, the flexible circuit board is bonded to the bonding zone of the display substrate, while the control chip is installed on the flexible circuit board to be electrically connected with the display zone. Alternatively, the control chip is directly bonded to the bonding zone to be electrically connected with the display zone.

For example, the control chip can be central processing unit (CPU), digital signal processor, System-on-a-Chip (SoC), and the like. For example, the control chip can also comprises a memory, a power module, etc., and can achieve power supply and signal input and output functions through additional wires, signal wires, etc. For example, the control chip can further comprise hardware circuits and computer-executable codes. The hardware circuits can comprise conventional Very Large Scale Integration (VLSI) circuits or gate arrays, as well as existing semiconductors such as logic chips and transistors or other discrete components. The hardware circuits can also comprises field programmable gate arrays, programmable array logics, programmable logic devices, etc.

For example, the display device provided in at least an embodiment of the present disclosure can be any products or component which have a display function, such as, mobile phones, tablet computers, television, displays, notebook computers, digital photo frame, navigator, or the like.

At least an embodiment of the present disclosure further provides a method of manufacturing a display substrate comprising: providing a base substrate, the base substrate comprising a display zone and a peripheral zone surrounding at least the display zone, the peripheral zone comprising a test bonding zone located on a side of the display zone and a bonding peripheral zone, the bonding peripheral zone being located between the test bonding zone and the display zone; and forming a sub-pixel unit located within the display zone. The forming the sub-pixel unit located within the display zone comprises: forming a pixel structure. The forming the pixel structure comprises forming a pixel drive circuit, a first planarization layer, a first relay electrode, a second planarization layer and a light-emitting element, wherein the pixel drive circuit comprises a first display-zone metal layer. The first planarization layer is disposed on a side of the pixel drive circuit away from the base substrate to provide a first planarization surface and comprises a first via-hole; the first relay electrode is disposed on a surface of the first planarization layer and electrically connected with the first display-zone metal layer of the pixel drive circuit through the first via-hole. The second planarization layer is disposed on a side of the first relay electrode away from the base substrate to provide a second planarization surface and comprises a second via-hole; and the light-emitting element is disposed on a surface of the second planarization layer, and electrically connected with the first relay electrode through the second via-hole. The method further comprises: forming data lines in the display zone, the data lines being formed to provide a data signal to the sub-pixel unit; forming scan lines in the display zone, the scan lines being formed to provide a control signal to the sub-pixel unit; forming a plurality of the test contact pads in the test bonding zone, wherein each of the plurality of the test contact pads comprises a first test-contact-pad metal layer located on the base substrate and a second test-contact-pad metal layer located on a side of the first test-contact-pad metal layer away from the base substrate, wherein the second test-contact-pad metal layer covers the first test-contact-pad metal layer and contacts the first test-contact-pad metal layer in at least portion of the periphery of the first test-contact-pad metal layer. The method further comprising: forming a first peripheral-zone insulating layer in the test bonding zone, the first peripheral-zone insulating layer being formed to expose the surface of the plurality of the test contact pads facing away from the base substrate, and cover at least a portion of periphery of the second test-contact-pad metal layer; wherein the first display-zone metal layer and the first test-contact-pad metal layer are formed by the same first metal material layer, the first relay electrode and the second test-contact-pad metal layer is formed with the same second metal material layer, and the first peripheral-zone insulating layer and the second planarization layer are formed by the same insulating material layer.

For example, in the display substrate obtained by the manufacturing method of the above-described embodiment, the second test-contact-pad metal layer is formed to cover the first test-contact-pad metal layer and contacts the first test-contact-pad metal layer in at least a portion of the periphery of the first test-contact-pad metal layer, which can reduce the step difference of film which the test contact pad is located, so that the detection probe can better contact the test contact pad during the lighting test stage, thereby improving the detection efficiency and yield of the products.

For example, in some examples of the present disclosure, the manufacturing method further comprises: forming a peripheral-zone insulating laminate in the bonding peripheral zone. The peripheral-zone insulating laminate is formed to comprise a plurality of insulating layers, for example compress at least two insulating layers. One insulating layer of at least two insulating layers away from the base substrate exposes the other insulating layer of the at least two insulating layers adjacent to the base substrate on a side of the one insulating layer adjacent to the base substrate, so as to form at least two stepped structure on the periphery of the test bonding zone.

For example, in some examples of the present disclosure, the peripheral-zone insulating laminate is formed to comprise a first sublayer, a second sublayer and a third sublayer, wherein the third sublayer is formed to be located on a side of the first sublayer away from the base substrate, the second sublayer is formed to be located between the first sublayer and the third sublayer, the second sublayer is formed to expose the first sublayer on a side of the second sublayer adjacent to the base substrate, the third sublayer is formed to expose the second sublayer on a side of the third sublayer adjacent to the base substrate. The first sublayer and the first planarization layer are formed by the same insulating material layer. The second sublayer and the second planarization layer and the first peripheral-zone insulating layer are formed by the first insulating material layer in the same layer.

For example, in some examples of the present disclosure, forming the second sublayer and the second planarization layer and the first peripheral-zone insulating layer by the first insulating material layer in the same layer comprises: after forming the plurality of the test contact pad, the first sublayer and the first relay electrode, depositing the first insulating material layer on the base substrate, patterning the first insulating material layer, so that a portion of the first insulating material layer located in the display zone is formed as the second planarization layer and a second via-hole is formed in the second planarization layer. Next, removing a portion of the first insulating material layer overlapping the test contact pad, thinning a portion of the first insulating material layer located in the test bonding zone and on the periphery of the plurality of the test contact pads to form a first peripheral-zone insulating layer; and removing a portion of the first insulating material layer overlapping the edge of the first sublayer and adjacent to the test bonding zone to expose the first sublayer, and thinning a portion of the first insulating material layer in the bonding peripheral zone to form the second sublayer.

For example, in some examples of the present disclosure, patterning the first insulating material layer comprises: patterning the first insulating material layer by using a gray-tone mask or a half-tone mask patterning process.

Hereinafter, the method of manufacturing the display substrate of the embodiments of the present disclosure are described in details, by taking the fabrication of the display substrate as shown in FIG. 2 to FIG. 6 as example and with reference to FIG. 17A to FIG. 17K.

For example, the sub-pixel unit 20 of the display zone 101 of the display substrate 1 can comprise a pixel structure. The pixel structure can comprise a buffer layer 211, a pixel drive circuit 221, a first planarization layer 232, a first relay electrode 241, a second planarization layer 251, a light-emitting element 26, a pixel definition layer 216, a first display-zone insulating layer 218, and an auxiliary electrode 219.

For example, a base substrate 100 is provided. The base substrate 100 comprises a display zone and a peripheral zone 102 surrounding the display zone 101. The peripheral zone 102 comprises a test bonding zone 107 located on a side of the display zone and a bonding peripheral zone 106 surrounding the test bonding zone 107. For example, the buffer layer 211 is formed in the display zone 101 of the base substrate 100, the bonding peripheral zone 106 and the test bonding zone by means of deposition method.

For example, the base substrate 100 can comprise organic materials, e.g., the organic materials can be polyimides, polycarbonates, polyacrylates, polyetherimines, polyethersulfones, polyethylene terephthalates, polyethylene naphthalates, or other resinous materials. The base substrate 100 can be a flexible or inflexible substrate, and the embodiments of the present disclosure are not limited thereto.

For example, the material of the buffer layer 211 can comprise silicon oxide, silicon nitride, silicon oxynitride, or other insulating materials.

For example, an active layer 222 is formed on the buffer layer 211 in the display zone 101. For example, a semiconductor material layer is deposited onto the base substrate 100, and then patterned to form the active layer 222. The active layer 222 can comprise a source electrode zone 222A and a drain electrode zone 222B, as well as a channel region located between the source electrode zone 222A and the drain electrode zone 222B.

For example, the semiconductor material of the active layer 222 can comprise polycrystalline silicon, or oxide semiconductors (e.g., Indium Gallium Zinc Oxide), or the like.

For example, after the active layer 222 is formed, the first gate insulating layer 211 is formed on the active layer 222 by means of deposition method or the like. The material of the first gate insulating layer 211 can comprise, e.g., silicon oxide, silicon nitride, silicon oxynitride, or other insulating materials.

For example, after the first gate insulating layer 211 is formed, the gate electrode 223 and the first capacitance electrode 271 are formed on the first gate insulating layer 211 of the display zone 101 by a patterning process. The material of the gate electrode 223 and the first capacitance electrode 271 can comprise metal materials or alloy materials, such as, a mono-layer or multi-layer metal structure formed by molybdenum, aluminum, titanium, and the like. For example, the multilayer structure is a multilayer metal laminate (such as, a titanium-aluminum-titanium three-layer metal laminate).

In some examples, the active layer 222 is doped by using the gate electrode 223 as the mask to form the source electrode zone 222A and the drain electrode zone 222B which are electrically conductive, while the channel region between the source electrode zone 222A and the drain electrode zone 222B is not doped due to the blocking effect of the gate electrode.

For example, after the gate electrode 223 and the first capacitance electrode 271 are formed, the second gate insulating layer 212 is formed on the gate electrode 222 and the first capacitance electrode 271 by depositing an insulating material onto the base substrate by means of deposition method or the like. The material of the second gate insulating layer 212 can comprise, e.g., silicon oxide, silicon nitride, silicon oxynitride, or other insulating materials.

For example, a metal material layer is then deposited onto the base substrate in the display zone, and the second capacitance electrode 272 is formed by a patterning process performed on a portion of the metal material layer overlapping the first capacitance electrode 271. The first capacitance electrode 271 and the second capacitance electrode 272 are implemented as the storage capacitor 27.

For example, after forming the second capacitance electrode 272, an interlayer insulating layer 213 can be formed in the display zone 101 by means of deposition method or the like, and the material of the interlayer insulating layer 213 can comprise, e.g., silicon oxide, silicon nitride, silicon oxynitride, or other insulating materials.

For example, via-holes are formed in the first gate insulating layer 211, the second gate insulating layer 212 and the interlayer insulating layer 213 to expose the source electrode zone 222A and the drain electrode zone 222B of the active layer 222.

Figures 17A, 17B, 17C:
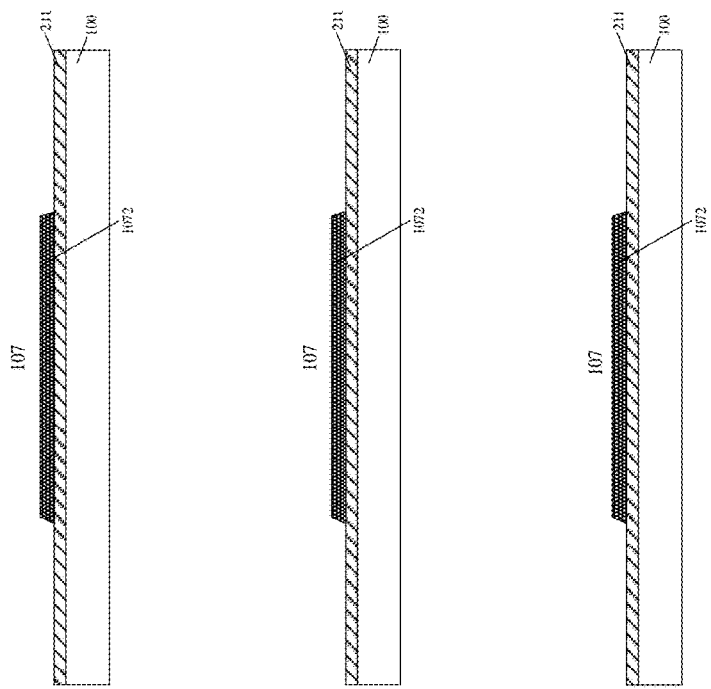

For example, as shown in FIG. 17A, the metal materials or alloy materials are deposited. Then, the patterning process is used to form the source electrode 224 and the drain electrode 225 in the display zone 101, form the first test-contact-pad metal layer 1072 and the marker metal layer 1077 in the test bonding zone 107. The source electrode 224 and the drain electrode 225 are electrically connected with the source electrode zone 222A and the drain electrode zone 222B through via-holes in the first gate insulating layer 211, the second gate insulating layer 212 and the interlayer insulating layer 213. The material of the source electrode 224 and the drain electrode 225, the first test-contact-pad metal layer 1072 and the marker metal layer 1077 can comprise metal materials or alloy materials, such as, a mono-layer or multi-layer metal structure formed by molybdenum, aluminum, titanium, and the like. For example, the multilayer structure is a multilayer metal laminate such as, a titanium-aluminum-titanium three-layer metal laminate).

For example, as shown in FIG. 17B, the insulating materials are deposited; then, Then, the patterning process is used to form a passivation layer 215 covering the source electrode 224 and the drain electrode 225, form the interlayer insulating layer 213 in the display zone 101, form the passivation-layer via-hole 215A in the passivation layer 215 to expose the drain electrode 225 (or the source electrode 224), and form the fourth sublayer 1085 in the bonding peripheral zone 106. For example, the material of the passivation layer 215 and the fourth sublayer 1085 can comprise organic insulating materials or inorganic insulating materials, such as, silicon nitride materials, which can protect the pixel drive circuit from moisture corrosion well due to its high dielectric constant and good hydrophobic function.

For example, as shown in FIG. 17C, the insulating materials are deposited; and then the patterning process is used to form the first planarization layer 232 in the display 101, form the first via-hole 233 in the first planarization layer 232, and form the first sublayer 1082 in the bonding peripheral zone 106. The first sublayer 1082 is formed to exposes the fourth sublayer 1085 on a side of the first sublayer 1082 adjacent to the base substrate 100.

For example, as shown in FIG. 17D, a metal material layer is deposited onto the base substrate 100. The metal material layer is patterned so as to form the first relay electrode 241 in the display zone 101, and form the second test-contact-pad metal layer 1073 in the test bonding zone 107. The second test-contact-pad metal layer 1073 covers the first test-contact-pad metal layer 1072 so as to prevent the first test-contact-pad metal layer 1072 from corrosion. The material of the first relay electrode 241, the first test-contact-pad metal layer 1072 and the second test-contact-pad metal layer 1073 can comprise metal materials or alloy materials, such as, a mono-layer or multi-layer metal structure formed by molybdenum, aluminum, titanium, and the like.

For example, as shown in FIG. 17E, the first insulating material layer 120 is deposited onto the base substrate 100. The first insulating material layer 120 can comprise silicon oxide, silicon nitride, silicon oxynitride, or other insulating materials. The photoresist 130 is deposited onto the first insulating material layer 120. A first mask 140 is provided to expose the photoresist 130. The first mask 140 comprises a light-fully-transmissive region, a light-partially-transmissive region and light non-transmissive region. For example, the first mask 140 comprises a light-fully-transmissive pattern 141 which overlaps with a portion of the second test-contact-pad metal layer 1073 of the test contact pad in the test bonding zone 107, a portion of the first sublayer 1082 in the bonding peripheral zone 106 adjacent to the test bonding zone 107, and a portion of the first relay electrode 241 in the display zone 101. For example, the first mask 140 further comprises a light-partially-transmissive pattern 142 which overlaps with the gap between the test bonding zone 107 and the test contact pad and the edge of the first sublayer 1082 in the bonding peripheral zone 106. For example, the first mask 140 further comprises a light non-transmissive zone 143 which corresponds to the bonding peripheral zone 106 and the display zone 101. The first mask 140 is a gray-tone mask or a half-tone mask. The photoresist can be a positive photoresist, and accordingly the light transmittance of the light-partially-transmissive pattern 142 is less than that of the light-fully-transmissive pattern 141. During the exposure process, in the case that the portion of the photoresist 130 corresponding to the light-fully-transmissive pattern 141 is fully exposed, the portion of the photoresist 130 corresponding to the light-partially-transmissive pattern 142 are partially exposed. The portion of the photoresist 130 corresponding to the light non-transmissive pattern 143 is not exposed.

For example, as shown in FIG. 17F, the photoresist 130 is developed, and the fully exposed portion of the photoresist 130 is removed. That is, in the test bonding zone 107, the portion of photoresist 130 overlapping the test contact pad 1071 is removed. The partially exposed portion of the photoresist 130 is thinned, while the thickness of the unexposed portion of the photoresist 130 is substantially unchanged. After development, the photoresist 130 is formed as a photoresist pattern 131 in the test bonding zone 107, and a photoresist pattern 132 in the bonding peripheral zone 106. Also, the fully exposed photoresist 130 in the display zone 101 is removed. After development, the photoresist 130 is formed as the photoresist pattern 133 in the display zone.

For another example, in the above-mentioned patterning process, the photoresist may be a negative photoresist, and thus the mask is complementary to the above-described first mask 130. After the exposure and development, the above-mentioned photoresist pattern 131, the photoresist pattern 132, and the photoresist pattern 133 are obtained.

For example, still as shown in FIG. 17F, the first insulating material layer 120 in the test bonding zone 107, the bonding peripheral zone 106 and the display zone 101 are subject to etching, so as to remove a portion of the first insulating material layer overlapping the test contact pad 1071 in the test bonding zone 107, and remove a portion of the first insulating layer located in the bonding peripheral zone 106 and on a side of the first sublayer 1082 adjacent to a side of the test bonding zone 107 to expose the edge of the fourth sublayer 1085, and form the second via-hole 252 in the display zone 101 to expose the first relay electrode 241.

For example, as shown in FIG. 17G, an ashing process is performed to remove the partially exposed photoresist pattern 131 in the test bonding zone 107, and thin the photoresist pattern 132 in the bonding peripheral zone 106 and the photoresist pattern 133 in the display zone 101, respectively. Then, the first insulating material layer 120 remaining in the test bonding zone 107 and the bonding peripheral zone 106 is etched by using the current photoresist pattern, and the etching thickness is controlled to expose the first sublayer 1082 in the bonding peripheral zone 106.

For example, as shown in FIG. 17H, the photoresist pattern 133 in the display zone 101 and the photoresist pattern 132 in the bonding peripheral zone 106 are removed. The remaining first insulating material layer is etched and the etching thickness is controlled, so as to form the second planarization layer 251 to provide a planarization surface, form the second sublayer 1083 in the bonding peripheral zone 106 and form the first peripheral-zone insulating layer 1074 in the test bonding zone 107. The second sublayer 1083 is formed to expose the first sublayer 1082 in a side of the second sublayer 1083 adjacent to the base substrate 100, and the first peripheral-zone insulating layer 1074 is formed to cover the edge of the second test-contact-pad metal layer 1073.

For example, as shown in FIG. 17I, the first electrode 261 of the light-emitting element 26 is formed on the second planarization layer 251 of the display zone 101; the pixel definition layer 216 is formed on the second planarization layer 251 and the first electrode 261; At the same time, the third sublayer 1084 is formed on the second sublayer 1083 of the bonding peripheral zone 106. The pixel definition layer 216 comprises a plurality of openings 2161 to define a plurality of pixel units. Each of the plurality of the openings 2161 exposes the respective first electrode 261. The third sublayer 1084 is formed to expose the second sublayer 1082 on a side of the third sublayer 1084 adjacent to the base substrate 100. The first electrode 261 of the light-emitting element 26 is electrically connected with the first relay electrode 241 through the second via-hole 252.

For example, the material of the first electrode 261 can comprise at least one of transparent conductive oxide materials, including indium tin oxide (ITO), indium zinc oxide (IZO), zinc oxide (ZnO) or the like. Moreover, the first electrode 1141 can comprise a metal with high reflectivity as the reflective layer, such as, silver (Ag).

For example, the materials of the pixel definition layer 216 and the third sublayer 1084 can comprise polyimides, polyphthalimides, polyamides, acrylic resins, benzocyclobutenes or phenolic resins or other organic insulating materials, or the materials of the pixel definition layer 216 and the third sublayer 1084 comprise silicon oxide, silicon nitride or other inorganic insulating materials, and the embodiments of the present disclosure are not limited thereto.

For example, as shown in FIG. 17J, the light-emitting layer 262 is subsequently formed in the plurality of the openings 2161 of the pixel definition layer 216, and then the second electrode 263 is formed on the pixel definition layer 216 and the light-emitting layer 262, e.g., the second electrode 263 can be formed in a portion or all of the display zone 101, so that it can be formed on the whole surface in the fabrication process.

For example, with regard to OLEDs, the light-emitting layer 262 can comprise small molecular or polymeric organic materials; for example it can be fluorescent or phosphorescent materials, and can emit red, green, blue, or white light. Furthermore, if required, the light-emitting layer can further comprise an electron injection layer, an electron transfer layer, a hole injection layer, a hole transfer layer or other functional layer(s). With regard to QLEDs, the light-emitting layer 1142 can comprise quantum dot materials, e.g., silicon quantum dot, germanium quantum dot, cadmium sulfide quantum dot, cadmium selenide quantum dot, cadmium telluride quantum dot, zinc selenide quantum dot, lead sulfide quantum dot, lead selenide quantum dot, indium phosphide quantum dot and indium arsenide quantum dot or the like. The particle size of the quantum dot is 2-20 nm.

For example, the second electrode 263 can comprise various conductive materials. For example, the second electrode 263 can comprise lithium (Li), aluminum (Al), magnesium (Mg), silver (Ag) or other metal materials.

For example, still as shown in FIG. 17J, the insulating material is deposited onto the light-emitting element 26 in the display zone, and a patterning process is used to form the first display-zone insulating layer 218 in the display zone 101, form the fifth sublayer 1086 in the bonding peripheral zone 106, and form the second peripheral-zone insulating layer 1075 in the test bonding zone 107. The first display-zone insulating layer 218 can provide a planarization surface. The fifth sublayer 1086 is formed to expose the third sublayer 1084 on a side of the fifth sublayer 1086 adjacent to the base substrate 100. The second peripheral-zone insulating layer 1075 is formed to have a plurality of first test-contact-pad via-holes 1075A so as to expose the surface of the plurality of the test contact pads 1071, respectively. The material of the first display-zone insulating layer 218, the fifth sublayer 1086 and the second peripheral-zone insulating layer 1075 can comprise inorganic insulating materials or organic insulating materials. The inorganic insulating materials can comprise silicon nitride, silicon oxide, silicon oxynitride, or other insulating materials. The inorganic materials including silicon nitride, silicon oxide, silicon oxynitride or the like have a high compactness, and can prevent the invasion of moisture, oxygen or the like. The organic insulating materials can be desiccant-containing polymeric materials or vapor-blocking polymeric materials or the like.

Figure 17K:
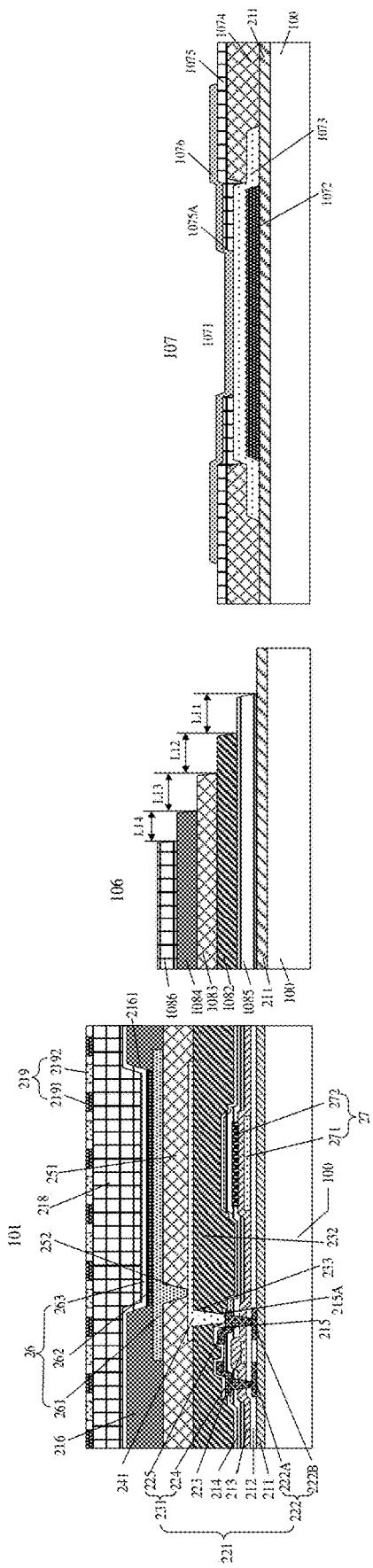

For example, as shown in FIG. 17K, a metal material layer is deposited onto the base substrate 100, and a patterning process is used to form the auxiliary electrodes 219 in the display zone 101, and form the first relay electrode pattern 1076 in the test bonding zone 107. The first relay electrode patterns 1076 covers the second peripheral-zone insulating layer 1075, and is electrically connected with the plurality of the test contact pads 1071 through the first test-contact-pad via-holes 1075A. The metal material layer can comprise indium tin oxide (ITO) and thus produces a transparent electrode. Alternatively, the materials for forming the auxiliary electrodes 219 and the first relay electrode pattern 1076 can comprise a metal mesh, which may also forms a transparent electrode.

It should be indicated that the method of manufacturing the display device in the embodiments of the present disclosure can comprise more or less operations which can be performed sequentially or in parallel. Although the procedures of the manufacturing method as described above comprise a plurality of operations occurring in a specific order, it should be clearly understood that the order of the plurality of the operations is not limited. The manufacturing method as described above can be performed once, or can be performed many times in accordance with predetermined conditions.

For example, in another embodiment, a manufacturing method of the display substrate as shown in FIG. 7 to FIG. 11 is provided. Comparing the structure of the display substrate as shown in FIG. 7 to FIG. 11 with that of the display substrate as shown in FIG. 2 to FIG. 6, in the display zone 201 of the structure of the display substrate as shown in FIG. 7 to FIG. 11, the second planarization layer and the first relay electrode are not arranged; the first electrode 361 of the light-emitting element 36 is electrically connected with the drain electrode 325 (or the source electrode 324) through the first via-hole 333 in the first planarization layer 332 and the passivation-layer via-hole 315A in the passivation layer 315. Additionally, the first peripheral-zone insulating layer 2074 in the test bonding zone 207 and the first planarization layer 332 in the display zone 201 are formed by the same patterning process after depositing the same insulating material.

For example, in another embodiment, a manufacturing method of the display substrate as shown in FIG. 12 to FIG. 16 is provided. Comparing the structure of the display substrate as shown in FIG. 12 to FIG. 16 with that of the display substrate as shown in FIG. 2 to FIG. 6, in the display zone 301 of the structure of the display substrate as shown in FIG. 12 to FIG. 16, the first display-zone insulating layer and the auxiliary electrodes 219 are not arranged, and the packaging layer 417 is disposed on a side of the light-emitting element 36 away from the base substrate. Additionally, the first peripheral-zone insulating layer 3074 in the test bonding zone 307 is disposed between the first test-contact-pad metal layer 3072 and the second test-contact-pad metal layer 3073, and covers the periphery of the first test-contact-pad metal layer 3072. The first peripheral-zone insulating layer 3074 and the passivation layer 315 in the display zone 101 are formed by the same patterning process after lining the insulating material.

For example, other process steps for manufacturing the display substrate as shown in FIG. 7 to FIG. 11 or the display substrate as shown in FIG. 12 to FIG. 16 can be referred to the method for manufacturing the display substrate as shown in FIG. 2 to FIG. 6, which are not reiterated here.

The technical effects of the manufacturing method of the display devices as provided in the above embodiments can be referred to those provided for the display device as provided in the embodiments of the present disclosure, which are not reiterated here.

The following statements should be noted:

(1) The accompanying drawings involve only the structure(s) in connection with the embodiment(s) of the present disclosure, and other structure(s) can be referred to common design(s).

In case of no conflict, embodiments and features in embodiments can be combined with each other to obtain new embodiments.

What is described in above are only illustrative embodiments of the disclosure, and the protection scope of the disclosure is not limited thereto. Any variation or replacement that person skilled in this technical field can easily think of within the technical scope of the disclosure are encompassed in the protection scope of the present disclosure. Thus, the protection scope of the present disclosure is defined by the accompanying claims.

What is claimed is:

1. A display substrate comprising:
a base substrate, comprising a display zone and a peripheral zone surrounding at least the display zone, the peripheral zone comprising a test bonding zone located on a side of the display zone;
a sub-pixel unit, located within the display zone and comprising:
a pixel structure comprising a pixel drive circuit, a first planarization layer, a first relay electrode, a second planarization layer and a light-emitting element, wherein the pixel drive circuit comprises a first display-zone metal layer, the first planarization layer is disposed on a side of the pixel drive circuit away from the base substrate to provide a first planarization surface and comprises a first via-hole, the first relay electrode is disposed on the first planarization surface and electrically connected with the first display-zone metal layer of the pixel drive circuit through the first via-hole, the second planarization layer is disposed on a side of the first relay electrode away from the base substrate to provide a second planarization surface and comprises a second via-hole, and the light-emitting element is disposed on the second planarization surface and electrically connected with the first relay electrode through the second via-hole;
a data line, located within the display zone and configured to provide a data signal to the sub-pixel unit;
a scan line, located within the display zone and configured to provide a control signal to the sub-pixel unit;
a plurality of test contact pads, located within the test bonding zone, wherein each of the plurality of the test contact pads comprises a first test-contact-pad metal layer and a second test-contact-pad metal layer, the first test-contact-pad metal layer is located on the base substrate, the second test-contact-pad metal layer is located on a side of the first test-contact-pad metal layer away from the base substrate, and the second test-contact-pad metal layer covers the first test-contact-pad metal layer and contacts the first test-contact-pad metal layer in at least portion of a periphery of the first test-contact-pad metal layer;
a first peripheral-zone insulating layer, located within the test bonding zone and configured to expose surfaces of the plurality of the test contact pads facing away from the base substrate and cover at least portion of a periphery of the second test-contact-pad metal layer;
an auxiliary electrode layer, comprising a plurality of first relay electrode patterns located within the test bonding zone and a plurality of auxiliary electrodes located within the display zone, the plurality of the auxiliary electrodes are located on a side of the sub-pixel unit away from the base substrate, the plurality of the first relay electrode patterns are located on a side of the first peripheral-zone insulating layer and the plurality of the test contact pads away from the base substrate, wherein the first display-zone metal layer and the first test-contact-pad metal layer are arranged in the same layer, the first relay electrode and the second test-contact-pad metal layer are arranged in a same layer, the first peripheral-zone insulating layer and the second planarization layer are arranged in a same layer, and the auxiliary electrodes and the first relay electrode patterns are arranged in a same layer,
a second peripheral-zone insulating layer, located within the test bonding zone,
wherein the second peripheral-zone insulating layer is disposed between the first peripheral-zone insulating layer and the plurality of the first relay electrode patterns and between the plurality of the test contact pads and the plurality of the first relay electrode patterns to cover the first peripheral-zone insulating layer and the plurality of the test contact pads,
wherein the second peripheral-zone insulating layer has a plurality of first test-contact-pad via-holes to expose the surfaces of the plurality of the test contact pads, respectively; the plurality of the first relay electrode patterns are electrically connected with the plurality of the test contact pads through the plurality of the first test-contact-pad via-holes;
wherein for at least one of the plurality of the test contact pads, the first peripheral-zone insulating layer comprises a first opening which is configured to expose a surface of at least one of the plurality of the test contact pads facing away from the base substrate, at least one of the plurality of first test-contact-pad via-holes comprises a second opening which is configured to expose part of the surface of at least one of the plurality of the test contact pads facing away from the base substrate;
wherein the second opening is connected with the first opening, the second opening is within and smaller than the first opening, and a part of the second peripheral-zone insulating layer covering the second test-contact-pad metal layer is located within the first opening and surrounds the second opening.

2. The display substrate according to claim 1, wherein a step difference in a direction perpendicular to the base substrate is provided between a surface of the first relay electrode pattern above the test contact pad away from the base substrate and a surface of the first relay electrode pattern on a periphery of the test contact pad away from the base substrate, and the step difference is ranged from 1.0 μm to 1.5 μm.

3. The display substrate according to claim 1, wherein the second test-contact-pad metal layer completely covers the first test-contact-pad metal layer and contacts the first test-contact-pad metal layer on the periphery of the first test-contact-pad metal layer.

4. The display substrate according to claim 1, wherein the pixel drive circuit further comprises a gate electrode, two source-drain electrodes and an interlayer insulating layer located on a side of the gate electrode away from the base substrate and on a side of the two source-drain electrodes adjacent to the base substrate,
wherein the two source-drain electrodes are located within the first display-zone metal layer.

5. The display substrate according to claim 1, wherein a vertical distance between a surface of the first peripheral-zone insulating layer away from the base substrate and the base substrate is greater than a vertical distance between the surfaces of the plurality of the test contact pads facing away from the base substrate and the base substrate.

6. The display substrate according to claim 1, wherein the plurality of the test contact pads are arranged in a row and parallel to each other,
wherein a row direction of the plurality of the test contact pads is parallel to an extension direction of a side edge of the display zone facing towards the test bonding zone.

7. The display substrate according to claim 1, further comprising:
- connection lines located within the peripheral zone, each connection line being electrically connected with the data line of the display zone,
- a test unit located within the peripheral zone, wherein the test unit is located between the display zone and the test bonding zone, and ends of the connection lines away from the display zone are gathered in the test unit,
- the first test-contact-pad metal layer of each of the plurality of the test contact pads is electrically connected with the test unit, and the first test-contact-pad metal layer of another of the plurality of the test contact pads is electrically connected with the scan line in the display zone.

8. The display substrate according to claim 1, further comprising a first display-zone insulating layer located within the display zone,
- wherein the first display-zone insulating layer is located between the light-emitting element and the plurality of the auxiliary electrodes,
- wherein the second peripheral-zone insulating layer and the first display-zone insulating layer are arranged in a same layer.

9. The display substrate according to claim 1, further comprising a marker metal layer, wherein the marker metal layer is located on a side of the first peripheral-zone insulating layer adjacent to the base substrate, arranged in a same layer as the first test-contact-pad metal layer, and electrically connected with the first test-contact-pad metal layer of the test contact pad on a periphery of the test bonding zone.

10. The display substrate according to claim 8, wherein the peripheral zone further comprises a bonding peripheral zone surrounding at least the test bonding zone, the display substrate further comprises:
- a peripheral-zone insulating laminate, located within the bonding peripheral zone and on the base substrate,
- wherein the peripheral-zone insulating laminate comprises at least two insulating layers, wherein one insulating layer of the at least two insulating layers away from the base substrate exposes the other insulating layer of the at least two insulating layers on a side of the one insulating layer adjacent to the base substrate so as to form at least two stepped structure on the periphery of the test bonding zone.

11. The display substrate according to claim 10, wherein the peripheral-zone insulating laminate comprises a first sublayer, a second sublayer and a third sublayer,
- the third sublayer is located on a side of the first sublayer away from the base substrate, and the second sublayer is located between the first sublayer and the third sublayer, wherein the second sublayer exposes the first sublayer on a side of the second sublayer adjacent to the base substrate, and the third sublayer exposes the second sublayer on a side of the third sublayer adjacent to the base substrate,
- wherein the first sublayer and the first planarization layer are arranged in a same layer, and the second sublayer and the second planarization layer are arranged in a same layer.

12. The display substrate according to claim 11, wherein the pixel structure further comprises a pixel definition layer, and the light-emitting element comprises a first electrode, a light-emitting layer and a second electrode,
- wherein the first electrode of the light-emitting element is electrically connected with one of the two source-drain electrodes through the first via-hole in the first planarization layer, the pixel definition layer is disposed on a side of the first electrode away from the base substrate, the pixel definition layer comprises a plurality of openings, the light-emitting layer is disposed in the plurality of the openings of the pixel definition layer, and the second electrode is disposed on a side of the light-emitting layer and the pixel definition layer away from the base substrate,
- the third sublayer and the pixel definition layer are arranged in a same layer.

13. The display substrate according to claim 11, wherein the peripheral-zone insulating laminate further comprises a fourth sublayer,
- the fourth sublayer is located on a side of the first sublayer adjacent to the base substrate,
- wherein the first sublayer exposes the fourth sublayer on a side of the first sublayer adjacent to the base substrate.

14. The display substrate according to claim 13, wherein the pixel structure further comprises a passivation layer, the passivation layer is located between the pixel drive circuit and the first planarization layer and comprises a passivation-layer via-hole,
- the pixel drive circuit is further electrically connected with the first relay electrode through the passivation-layer via-hole,
- wherein the fourth sublayer and the passivation layer are arranged in a same layer.

15. The display substrate according to claim 11, wherein the peripheral-zone insulating laminate further comprises a fifth sublayer,
- the fifth sublayer is located on a side of the third sublayer away from the base substrate,
- wherein the fifth sublayer exposes the third sublayer on a side of the fifth sublayer adjacent to the base substrate, and the fifth sublayer and the first display-zone insulating layer are arranged in a same layer.

16. A display device, comprising a display substrate, the display substrate comprising:
- a base substrate, comprising a display zone and a peripheral zone surrounding at least the display zone, the peripheral zone comprising a test bonding zone located on a side of the display zone;
- a sub-pixel unit, located within the display zone and comprising:
- a pixel structure comprising a pixel drive circuit, a first planarization layer, a first relay electrode, a second planarization layer and a light-emitting element, wherein the pixel drive circuit comprises a first display-zone metal layer, the first planarization layer is disposed on a side of the pixel drive circuit away from the base substrate to provide a first planarization surface and comprises a first via-hole, the first relay electrode is disposed on the first planarization surface and electrically connected with the first display-zone metal layer of the pixel drive circuit through the first via-hole, the second planarization layer is disposed on a side of the first relay electrode away from the base substrate to provide a second planarization surface and comprises a second via-hole, and the light-emitting element is disposed on the second planarization surface and electrically connected with the first relay electrode through the second via-hole;
- a data line, located within the display zone and configured to provide a data signal to the sub-pixel unit;
- a scan line, located within the display zone and configured to provide a control signal to the sub-pixel unit;

a plurality of test contact pads, located within the test bonding zone, wherein each of the plurality of the test contact pads comprises a first test-contact-pad metal layer and a second test-contact-pad metal layer, the first test-contact-pad metal layer is located on the base substrate, the second test-contact-pad metal layer is located on a side of the first test-contact-pad metal layer away from the base substrate, and the second test-contact-pad metal layer covers the first test-contact-pad metal layer and contacts the first test-contact-pad metal layer in at least portion of a periphery of the first test-contact-pad metal layer;

a first peripheral-zone insulating layer, located within the test bonding zone and configured to expose surfaces of the plurality of the test contact pads facing away from the base substrate and cover at least portion of a periphery of the second test-contact-pad metal layer;

an auxiliary electrode layer, comprising a plurality of first relay electrode patterns located within the test bonding zone and a plurality of auxiliary electrodes located within the display zone, the plurality of the auxiliary electrodes are located on a side of the sub-pixel unit away from the base substrate, the plurality of the first relay electrode patterns are located on a side of the first peripheral-zone insulating layer and the plurality of the test contact pads away from the base substrate, wherein the first display-zone metal layer and the first test-contact-pad metal layer are arranged in the same layer, the first relay electrode and the second test-contact-pad metal layer are arranged in a same layer, the first peripheral-zone insulating layer and the second planarization layer are arranged in a same layer, and the auxiliary electrodes and the first relay electrode patterns are arranged in a same layer, a second peripheral-zone insulating layer, located within the test bonding zone, wherein the second peripheral-zone insulating layer is disposed between the first peripheral-zone insulating layer and the plurality of the first relay electrode patterns and between the plurality of the test contact pads and the plurality of the first relay electrode patterns to cover the first peripheral-zone insulating layer and the plurality of the test contact pads, wherein the second peripheral-zone insulating layer has a plurality of first test-contact-pad via-holes to expose the surfaces of the plurality of the test contact pads, respectively; the plurality of the first relay electrode patterns are electrically connected with the plurality of the test contact pads through the plurality of the first test-contact-pad via-holes;

wherein for at least one of the plurality of the test contact pads, the first peripheral-zone insulating layer comprises a first opening which is configured to expose a surface of at least one of the plurality of the test contact pads facing away from the base substrate, at least one of the plurality of first test-contact-pad via-holes comprises a second opening which is configured to expose part of the surface of at least one of the plurality of the test contact pads facing away from the base substrate;

wherein the second opening is connected with the first opening, the second opening is within and smaller than the first opening, and a part of the second peripheral-zone insulating layer covering the second test-contact-pad metal layer is located within the first opening and surrounds the second opening.

17. A manufacturing method of a display substrate, the manufacturing method comprising:

providing a base substrate, the base substrate comprising a display zone and a peripheral zone surrounding at least the display zone, the peripheral zone comprising a test bonding zone and a bonding peripheral zone on a side of the display zone, the bonding peripheral zone is located between the test bonding zone and the display zone;

forming a sub-pixel unit located within the display zone, comprising:

forming a pixel structure, comprising: forming a pixel drive circuit, a first planarization layer, a first relay electrode, a second planarization layer and a light-emitting element, wherein the pixel drive circuit comprises a first display-zone metal layer; the first planarization layer is located on a side of the pixel drive circuit away from the base substrate to provide a first planarization surface, and comprises a first via-hole; the first relay electrode is located on the first planarization surface, and electrically connected with the first display-zone metal layer of the pixel drive circuit through the first via-hole; the second planarization layer is located on a side of the first relay electrode away from the base substrate to provide a second planarization surface, and comprises a second via-hole; and the light-emitting element is located on the second planarization surface and electrically connected with the first relay electrode through the second via-hole;

forming a data line in the display zone, the data line being formed to provide a signal to the sub-pixel unit;

forming a scan line in the display zone, the scan line being formed to provide a control signal to the sub-pixel unit;

forming a plurality of test contact pads in the test bonding zone, wherein each of the plurality of the test contact pads comprises a first test-contact-pad metal layer located on the base substrate and a second test-contact-pad metal layer located on a side of the first test-contact-pad metal layer away from the base substrate, the second test-contact-pad metal layer covers the first test-contact-pad metal layer and contacts the first test-contact-pad metal layer in at least portion of a periphery of the first test-contact-pad metal layer;

forming a first peripheral-zone insulating layer in the test bonding zone, wherein the first peripheral-zone insulating layer is formed to expose surfaces of the plurality of the test contact pads facing away from the base substrate and cover at least portion of a periphery of the second test-contact-pad metal layer;

forming an auxiliary electrode layer, comprising: forming a plurality of first relay electrode patterns in the test bonding zone and forming a plurality of auxiliary electrodes in the display zone, wherein the plurality of the auxiliary electrodes are located on a side of the sub-pixel unit away from the base substrate, and the plurality of the first relay electrode patterns are located on a side of the first peripheral-zone insulating layer and the plurality of the test contact pads away from the base substrate, wherein the first display-zone metal layer and the first test-contact-pad metal layer are formed by a same first metal material layer, the first relay electrode and the second test-contact-pad metal are formed by a same second metal material layer, the first peripheral-zone insulating layer and the second planarization layer are formed by a same insulating material layer, and the auxiliary electrodes and the first relay electrode patterns are formed by a same conductive material layer, forming a second peripheral-zone insulating layer, located within the test bonding zone,
wherein the second peripheral-zone insulating layer is disposed between the first peripheral-zone insulating layer and the plurality of the first relay electrode patterns and between the plurality of the test contact pads and the plurality of the first relay electrode patterns to cover the first peripheral-zone insulating layer and the plurality of the test contact pads,
wherein the second peripheral-zone insulating layer has a plurality of first test-contact-pad via-holes to expose the surfaces of the plurality of the test contact pads, respectively; the plurality of the first relay electrode patterns are electrically connected with the plurality of the test contact pads through the plurality of the first test-contact-pad via-holes;
wherein for at least one of the plurality of the test contact pads, the first peripheral-zone insulating layer comprises a first opening which is configured to expose a surface of at least one of the plurality of the test contact pads facing away from the base substrate, at least one of the plurality of first test-contact-pad via-holes comprises a second opening which is configured to expose part of the surface of at least one of the plurality of the test contact pads facing away from the base substrate;
wherein the second opening is connected with the first opening, the second opening is within and smaller than the first opening, and a part of the second peripheral-zone insulating layer covering the second test-contact-pad metal layer is located within the first opening and surrounds the second opening.

18. The manufacturing method according to claim 17, further comprising:
forming a peripheral-zone insulating laminate in the bonding peripheral zone,
wherein the peripheral-zone insulating laminate is formed to comprise at least two insulating layers, one insulating layer of the at least two insulating layers away from the base substrate expose the other insulating layer of the at least two insulating layers adjacent to the base substrate on a side of the one insulating layer adjacent to the base substrate, so as to form at least two stepped structure on a periphery of the test bonding zone.

19. The manufacturing method according to claim 18, wherein the peripheral-zone insulating laminate is formed to comprise a first sublayer, a second sublayer and a third sublayer,
the third sublayer is formed to be located on a side of the first sublayer away from the base substrate, and the second sublayer is formed to be located between the first sublayer and the third sublayer, wherein the second sublayer is formed to expose the first sublayer on a side of the second sublayer adjacent to the base substrate, and the third sublayer is formed to expose the second sublayer on a side of the third sublayer adjacent to the base substrate,
wherein the first sublayer and the first planarization layer are formed by a same insulating material layer; the second sublayer, the second planarization layer and the first peripheral-zone insulating layer are formed by a same first insulating material layer.

\* \* \* \* \*